(12) United States Patent
Sun et al.

(10) Patent No.: US 12,131,700 B2
(45) Date of Patent: Oct. 29, 2024

(54) PIXEL CIRCUIT, PIXEL DRIVING METHOD, LIGHT EMITTING BASE PLATE AND LIGHT EMITTING APPARATUS

(71) Applicants: Beijing BOE Technology Development Co., Ltd., Beijing (CN); BOE Technology Group Co., Ltd., Beijing (CN)

(72) Inventors: Tuo Sun, Beijing (CN); Ying Zhou, Beijing (CN); Yichi Zhang, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/792,755

(22) PCT Filed: Aug. 30, 2021

(86) PCT No.: PCT/CN2021/115407
§ 371 (c)(1),
(2) Date: Jul. 14, 2022

(87) PCT Pub. No.: WO2023/028772
PCT Pub. Date: Mar. 9, 2023

(65) Prior Publication Data
US 2024/0242668 A1  Jul. 18, 2024

(51) Int. Cl.
*G09G 3/32* (2016.01)
*G09G 3/3233* (2016.01)
(Continued)

(52) U.S. Cl.
CPC ............. *G09G 3/3233* (2013.01); *G09G 3/32* (2013.01); *G09G 2300/0426* (2013.01);
(Continued)

(58) Field of Classification Search
CPC .............. A61B 2090/365; A61B 90/37; G02B 2027/014; G02B 27/0172;
(Continued)

(56) References Cited

U.S. PATENT DOCUMENTS

| 2010/0102732 A1 | 4/2010 | Peeters et al. |
| 2013/0093323 A1 | 4/2013 | Radermacher |

(Continued)

FOREIGN PATENT DOCUMENTS

| CN | 113257185 A | 8/2021 |
| KR | 20210059075 A | 5/2021 |

OTHER PUBLICATIONS

Extended (Supplementary) European Search Report dated Nov. 28, 2023, issued in counterpart EP Application No. 21955352.6. (9 pages).

*Primary Examiner* — Insa Sadio
(74) *Attorney, Agent, or Firm* — WHDA, LLP

(57) ABSTRACT

The pixel circuit includes a first driving circuit, a first light emitting device, a second light emitting device and a second driving circuit that are sequentially connected in series; first driving circuit includes a first driving transistor, a source electrode of first driving transistor is connected to a first power-supply terminal, and a drain electrode of first driving transistor is connected to a first electrode of first light emitting device; second driving circuit includes a second driving transistor, a source electrode of second driving transistor is connected to a second power-supply terminal, and a drain electrode of second driving transistor is connected to a first electrode of second light emitting device; a second electrode of first light emitting device is connected to a second electrode of second light emitting device; and a channel type of first driving transistor and a channel type of second driving transistor are different.

20 Claims, 11 Drawing Sheets

(51) Int. Cl.
*H10K 59/121* (2023.01)
*H10K 59/131* (2023.01)

(52) U.S. Cl.
CPC .............. *G09G 2300/0439* (2013.01); *G09G 2330/021* (2013.01); *H10K 59/121* (2023.02); *H10K 59/131* (2023.02)

(58) Field of Classification Search
CPC ....... G09G 2320/0693; G09G 2340/12; G09G 2354/00; G09G 2380/08; G09G 3/001
See application file for complete search history.

(56) References Cited

U.S. PATENT DOCUMENTS

| | | | |
|---|---|---|---|
| 2019/0088200 A1* | 3/2019 | Woo | G09G 3/3275 |
| 2020/0402443 A1* | 12/2020 | Lou | G09G 3/2003 |
| 2022/0392923 A1 | 12/2022 | Oh et al. | |

* cited by examiner

PIXEL CIRCUIT, PIXEL DRIVING METHOD, LIGHT EMITTING BASE PLATE AND LIGHT EMITTING APPARATUS

TECHNICAL FIELD

The present disclosure relates to the technical field of photoelectricity, more particularly to a pixel circuit, a pixel driving method, a light emitting base plate and a light emitting apparatus.

BACKGROUND

For light emitting base plates of the structure of Active-Matrix Organic Light Emitting Diode (AMOLED) or Active-Matrix Quantum Dot Light Emitting Diode (AMQLED), in order to ensure the uniformity of the brightness of the light emitting pixels, it is required to determine the driving voltage of the pixels according to the maximum value of the brightness of the light emitting pixels, and it is also required to ensure that the driving transistors of the light emitting pixels maintain outputting at the saturation region at a same time.

SUMMARY

The present disclosure provides a pixel circuit, wherein the pixel circuit includes a first driving circuit, a first light emitting device, a second light emitting device and a second driving circuit that are sequentially connected in series;
  the first driving circuit includes a first driving transistor, a source electrode of the first driving transistor is connected to a first power-supply terminal, and a drain electrode of the first driving transistor is connected to a first electrode of the first light emitting device;
  the second driving circuit includes a second driving transistor, a source electrode of the second driving transistor is connected to a second power-supply terminal, and a drain electrode of the second driving transistor is connected to a first electrode of the second light emitting device;
  a second electrode of the first light emitting device is connected to a second electrode of the second light emitting device; and
  a channel type of the first driving transistor and a channel type of the second driving transistor are different.

In an alternative implementation, the channel type of the first driving transistor is a P type, the channel type of the second driving transistor is an N type, the first electrode of the first light emitting device is an anode, the first electrode of the second light emitting device is a cathode, and a voltage inputted by the first power-supply terminal is greater than a voltage inputted by the second power-supply terminal; or
  the channel type of the first driving transistor is an N type, the channel type of the second driving transistor is a P type, the first electrode of the first light emitting device is a cathode, the first electrode of the second light emitting device is an anode, and a voltage inputted by the first power-supply terminal is less than a voltage inputted by the second power-supply terminal.

In an alternative implementation, the pixel circuit further includes:
  a bleeder component, connected to a first node, wherein the first node is connected to the second electrode of the first light emitting device and the second electrode of the second light emitting device, so that a difference between an electric current in the first light emitting device and an electric current in the second light emitting device is equal to an electric current in the bleeder component.

In an alternative implementation, the bleeder component includes a first transistor and a second transistor that have a same channel type:
  a first electrode of the first transistor is connected to a first voltage inputting terminal, and a second electrode of the first transistor and a grid electrode of the first transistor are connected to the first node; and
  a first electrode of the second transistor is connected to the first node, and a second electrode of the second transistor and a grid electrode of the second transistor are connected to a second voltage inputting terminal.

In an alternative implementation, the first driving circuit includes:
  a first capacitor, wherein a first electrode of the first capacitor is connected to the first power-supply terminal, and a second electrode of the first capacitor is connected to a grid electrode of the first driving transistor;
  a first resetting module configured for, at a first resetting stage, transmitting a signal of a first initialized-voltage terminal to the grid electrode of the first driving transistor and the second electrode of the first capacitor;
  a first writing module configured for, at a first writing stage, writing a data signal of a first data writing terminal into the source electrode of the first driving transistor;
  a first compensating module configured for, at the first writing stage, conducting the drain electrode of the first driving transistor with the grid electrode of the first driving transistor; and
  a first light-emission controlling module configured for, at the first resetting stage and the first writing stage, disconnecting the source electrode of the first driving transistor from the first power-supply terminal, disconnecting the drain electrode of the first driving transistor from the first electrode of the first light emitting device, and, at a light-emission stage, conducting the source electrode of the first driving transistor with the first power-supply terminal, and conducting the drain electrode of the first driving transistor with the first electrode of the first light emitting device; and
  the second driving circuit includes:
  a second capacitor, wherein a first electrode of the second capacitor is connected to the second power-supply terminal, and a second electrode of the second capacitor is connected to a grid electrode of the second driving transistor;
  a second resetting module configured for, at a second resetting stage, transmitting a signal of a second initialized-voltage terminal to the grid electrode of the second driving transistor and the second electrode of the second capacitor;
  a second writing module configured for, at a second writing stage, writing a data signal of a second data writing terminal into the source electrode of the second driving transistor;
  a second compensating module configured for, at the second writing stage, conducting the drain electrode of the second driving transistor with the grid electrode of the second driving transistor; and
  a second light-emission controlling module configured for, at the second resetting stage and the second writing stage, disconnecting the source electrode of the second driving transistor from the second power-supply terminal, disconnecting the drain electrode of the second driving transistor from the first electrode of the second light emitting device, and, at the light-emission stage, conducting the source electrode of the second driving transistor with the second power-supply terminal, and conducting the drain electrode of the second driving transistor with the first electrode of the second light emitting device.

The present disclosure provides a light emitting base plate, wherein the light emitting base plate includes the pixel circuit according to any one of the above embodiments.

In an alternative implementation, the light emitting base plate includes a plurality of pixel units, and the first light emitting device and the second light emitting device are located in a same pixel unit.

In an alternative implementation, in the same pixel unit, the pixel circuit further includes a third light emitting device and a third driving circuit;
  the third driving circuit includes a third driving transistor, a source electrode of the third driving transistor is connected to the second power-supply terminal, and a drain electrode of the third driving transistor is connected to a first electrode of the third light emitting device;
  a second electrode of the third light emitting device is connected to the second electrode of the first light emitting device and the second electrode of the second light emitting device; and
  a channel type of the third driving transistor and the channel type of the second driving transistor are the same.

In an alternative implementation, the first light emitting device is a light emitting device capable of emitting a blue light, the second light emitting device is a light emitting device capable of emitting a green light, and the third light emitting device is a light emitting device capable of emitting a red light.

In an alternative implementation, the plurality of pixel units include a first pixel unit and/or a second pixel unit, and both of the first pixel unit and the second pixel unit includes the pixel circuit;
  in the first pixel unit, the channel type of the first driving transistor is a P type, the channel type of the second driving transistor and the channel type of the third driving transistor are an N type, the first electrode of the first light emitting device is an anode, the first electrode of the second light emitting device and the first electrode of the third light emitting device are a cathode, and a voltage inputted by the first power-supply terminal is greater than a voltage inputted by the second power-supply terminal; and
  in the second pixel unit, the channel type of the first driving transistor is an N type, the channel type of the second driving transistor and the channel type of the third driving transistor are a P type, the first electrode of the first light emitting device is a cathode, the first electrode of the second light emitting device and the first electrode of the third light emitting device are an anode, and a voltage inputted by the first power-supply terminal is less than a voltage inputted by the second power-supply terminal.

In an alternative implementation, when the plurality of pixel units include the first pixel unit and the second pixel unit, the first pixel unit and the second pixel unit satisfy any one of the following conditions:
  the first pixel unit and the second pixel unit are located at different scanning lines of two neighboring scanning lines;
  the first pixel unit and the second pixel unit are located at different data columns of two neighboring data columns; and
  at least one of neighboring pixel units of the first pixel unit is the second pixel unit, and at least one of neighboring pixel units of the second pixel unit is the first pixel unit.

In an alternative implementation, the light emitting base plate includes a plurality of pixel units, the plurality of pixel units include a third pixel unit and a fourth pixel unit, the first light emitting device is located in the third pixel unit, and the second light emitting device is located in the fourth pixel unit.

In an alternative implementation, the third pixel unit includes one or more first sub-pixel units, each of the first sub-pixel units is provided with one instance of the first light emitting device and one instance of the first driving circuit, and the first light emitting devices in different instances of the first sub-pixel units are different;
  the fourth pixel unit includes one or more second sub-pixel units, each of the second sub-pixel units is provided with one instance of the second light emitting device and one instance of the second driving circuit, and the second light emitting devices in different instances of the second sub-pixel units are different; and
  the second electrode of any one of the first light emitting devices of the third pixel units is connected to the second electrodes of the second light emitting devices of the fourth pixel units.

In an alternative implementation, the third pixel unit and the fourth pixel unit are two neighboring pixel units, and the third pixel unit and the fourth pixel unit satisfy any one of the following conditions:
  the third pixel unit and the fourth pixel unit are located at different scanning lines of two neighboring scanning lines;
  the third pixel unit and the fourth pixel unit are located at different data columns of two neighboring data columns; and
  a neighboring pixel unit of the third pixel unit is the fourth pixel unit, and a neighboring pixel unit of the fourth pixel unit is the third pixel unit.

In an alternative implementation, the channel types of the first driving transistors in the third pixel units are a P type, the first electrodes of the first light emitting devices are an anode, the channel types of the second driving transistors in the fourth pixel units are an N type, the first electrodes of the second light emitting devices are a cathode, and a voltage inputted by the first power-supply terminal is greater than a voltage inputted by the second power-supply terminal; or
  the channel types of the first driving transistors in the third pixel units are an N type, the first electrodes of the first light emitting devices are a cathode, the channel types of the second driving transistors in the fourth pixel units are a P type, the first electrodes of the second light emitting devices are an anode, and a voltage inputted by the first power-supply terminal is less than a voltage inputted by the second power-supply terminal.

The present disclosure provides a light emitting apparatus, wherein the light emitting apparatus includes the light emitting base plate according to any one of the above embodiments.

The present disclosure provides a driving method of a pixel circuit, wherein the method is for driving the pixel circuit according to any one of the above embodiments, and the driving method includes:

at the light-emission stage, controlling the first light emitting device and the second light emitting device to synchronously emit light.

In an alternative implementation, when the first driving circuit includes the first capacitor, the first resetting module, the first writing module, the first compensating module and the first light-emission controlling module, and the second driving circuit includes the second capacitor, the second resetting module, the second writing module, the second compensating module and the second light-emission controlling module, before the light-emission stage, the method further includes:

at the first resetting stage, controlling the signal of the first initialized-voltage terminal to be transmitted to the grid electrode of the first driving transistor and the second electrode of the first capacitor, controlling the source electrode of the first driving transistor to be disconnected from the first power-supply terminal, and controlling the drain electrode of the first driving transistor to be disconnected from the first electrode of the first light emitting device;

at the first writing stage, controlling the data signal of the first data writing terminal to be written into the source electrode of the first driving transistor, controlling the drain electrode of the first driving transistor to be conducted with the grid electrode of the first driving transistor, controlling the source electrode of the first driving transistor to be disconnected from the first power-supply terminal, and controlling the drain electrode of the first driving transistor to be disconnected from the first electrode of the first light emitting device;

at the second resetting stage, controlling the signal of the second initialized-voltage terminal to be transmitted to the grid electrode of the second driving transistor and the second electrode of the second capacitor, controlling the source electrode of the second driving transistor to be disconnected from the second power-supply terminal, and controlling the drain electrode of the second driving transistor to be disconnected from the first electrode of the second light emitting device; and at the second writing stage, controlling the data signal of the second data writing terminal to be written into the source electrode of the second driving transistor, controlling the drain electrode of the second driving transistor to be conducted with the grid electrode of the second driving transistor, controlling the source electrode of the second driving transistor to be disconnected from the second power-supply terminal, and controlling the drain electrode of the second driving transistor to be disconnected from the first electrode of the second light emitting device;

at the light-emission stage, the method further includes: controlling the source electrode of the first driving transistor to be conducted with the first power-supply terminal, controlling the drain electrode of the first driving transistor to be conducted with the first electrode of the first light emitting device, controlling the source electrode of the second driving transistor to be conducted with the second power-supply terminal, and controlling the drain electrode of the second driving transistor to be conducted with the first electrode of the second light emitting device; and the second resetting stage and the first writing stage proceed synchronously.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are embodiments of the present disclosure, and a person skilled in the art can obtain other figures according to these figures without paying creative work. It should be noted that the proportions in the drawings are merely illustrative and do not indicate the actual proportions.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than the embodiments. the other embodiments that a person skilled in the art obtains on the basis of the embodiments of the present disclosure without paying creative work fall within the protection scope of the present disclosure.

Figure 1:
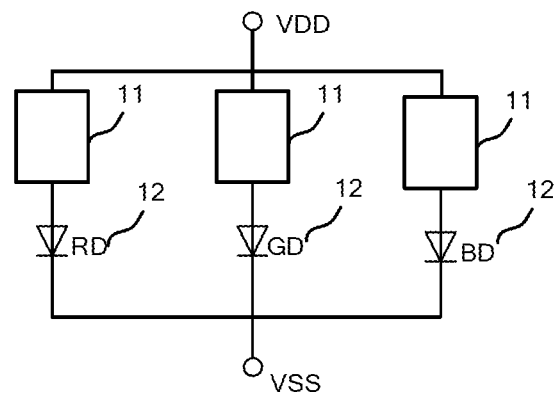
FIG. 1 schematically shows a schematic structural diagram of a pixel circuit in the related art.

Light emitting base plates of the structure of AMQLED or AMOLED may include a plurality of light emitting sub-pixels. In the related art, a light emitting sub-pixel is generally formed by connecting sequentially a first power-supply terminal VDD, a pixel driving circuit 11, a light emitting device 12 and a second power-supply terminal VSS, as shown in FIG. 1. When the transistor characteristics of the pixel driving circuits 11 are close, the magnitude of the voltage between the first power-supply terminal VDD and the second power-supply terminal VSS is mainly decided by the driving voltage of the light emitting device 12. Because the driving voltage of the blue-light device BD is far greater than the driving voltages of the red-light device RD and the green-light device GD, in order to ensure the normal light emission of the blue-light device BD, the magnitude of the voltage between the first power-supply terminal VDD and the second power-supply terminal VSS is decided by the driving voltage of the blue-light device BD, which results in that the driving voltages that are actually required by the red-light device RD and the green-light device GD are far lower than the voltage that is actually applied to the red-light device RD and the green-light device GD, which results in that a large amount of excessive voltage is applied to the red-light device RD and the green-light device GD, thereby causing increasing of the heating quantity and a waste of the power consumption.

Figure 2:
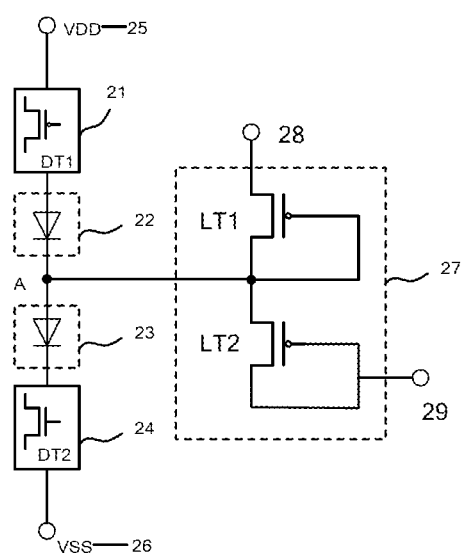
FIG. 2 schematically shows a schematic structural diagram of the first type of the pixel circuit.
Figure 3:
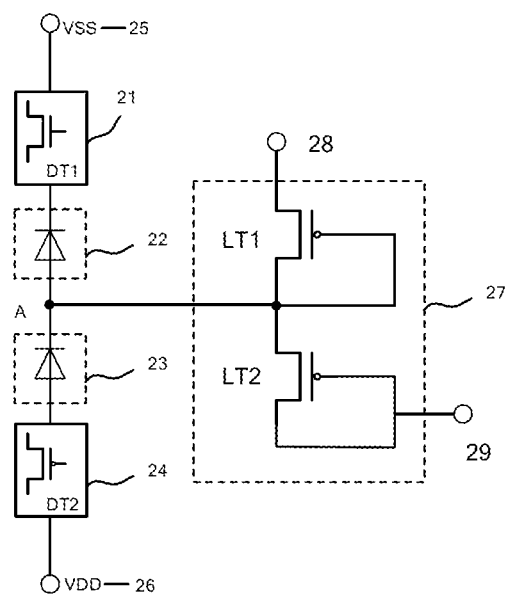
FIG. 3 schematically shows a schematic structural diagram of the second type of the pixel circuit.

An embodiment of the present disclosure provides a pixel circuit. Referring to FIGS. 2 and 3, FIGS. 2 and 3 individually schematically show a schematic structural diagram of the pixel circuit according to the present disclosure. As shown in FIGS. 2 and 3, the pixel circuit includes a first driving circuit 21, a first light emitting device 22, a second light emitting device 23 and a second driving circuit 24 that are sequentially connected in series.

The first driving circuit 21 includes a first driving transistor DT1, the source electrode of the first driving transistor DT1 is connected to a first power-supply terminal 25, and the drain electrode of the first driving transistor DT1 is connected to a first electrode of the first light emitting device 22.

The second driving circuit 24 includes a second driving transistor DT2, the source electrode of the second driving transistor DT2 is connected to a second power-supply terminal 26, and the drain electrode of the second driving transistor DT2 is connected to a first electrode of the second light emitting device 23.

A second electrode of the first light emitting device 22 is connected to a second electrode of the second light emitting device 23.

The channel type of the first driving transistor DT1 and the channel type of the second driving transistor DT2 are different.

The channel types of transistors may, for example, include a P type and an N type. When the channel type of one of the first driving transistor DT1 and the second driving transistor DT2 is the P type, the channel type of the other is the N type. The particular channel types of the first driving transistor DT1 and the second driving transistor DT2 are not limited in the present embodiment.

One of the first power-supply terminal 25 and the second power-supply terminal 26 may be a high-level-signal inputting terminal, and the other is a low-level-signal inputting terminal, which is not limited in the present embodiment. The high-level-signal inputting terminal inputs a high-level signal VDD, and the low-level-signal inputting terminal inputs a low-level signal VSS.

In the present embodiment, when the channel type of one of the first driving transistor DT1 and the second driving transistor DT2 is the P type, and the channel type of the other is the N type, the source electrode of the P-type driving transistor may be connected to the high-level-signal inputting terminal, and the source electrode of the N-type driving transistor may be connected to the low-level-signal inputting terminal.

In an alternative implementation, as shown in FIG. 2, the channel type of the first driving transistor DT1 is a P type, and the channel type of the second driving transistor DT2 is an N type. In such a case, the voltage signal inputted by the first power-supply terminal 25 may be the high-level signal VDD, and the voltage signal inputted by the second power-supply terminal 26 may be the low-level signal VSS. In the present implementation, the first electrode of the first light emitting device 22 is an anode, the second electrode of the first light emitting device 22 is a cathode, the first electrode of the second light emitting device 23 is a cathode, and the second electrode of the second light emitting device 23 is an anode.

Figure 4:
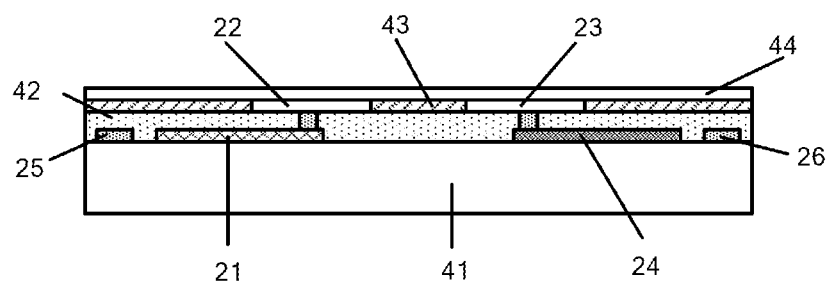
FIG. 4 schematically shows a schematic sectional structural diagram of the first type of the pixel circuit.

Referring to FIG. 4, FIG. 4 shows a schematic sectional structural diagram of the pixel circuit according to the present implementation. As shown in FIG. 4, the pixel circuit shown in FIG. 2 may be disposed on a substrate 41, and between the first light emitting device 22 and the first driving circuit 21, a medium layer 42 may be disposed between the second light emitting device 23 and the second driving circuit 24, and a pixel defining layer 43 may be disposed between the first light emitting device 22 and the second light emitting device 23. The electrode layer 44 in FIG. 4 also serves as the cathode of the first light emitting device 22 and the anode of the second light emitting device 23, and the first light emitting device 22 and the second light emitting device 23 realize the cathode-anode connection by using the electrode layer 44 vapor-deposited on the surfaces. The first light emitting device 22 in FIG. 4 is of an uprightly placed structure, and the second light emitting device 23 is of an inversely placed structure.

In another alternative implementation, as shown in FIG. 3, the channel type of the first driving transistor DT1 is an N type, and the channel type of the second driving transistor DT2 is a P type. In such a case, the voltage signal inputted by the first power-supply terminal 25 may be the low-level signal VSS, and the voltage signal inputted by the second power-supply terminal 26 may be the high-level signal VDD. In the present implementation, the first electrode of the first light emitting device 22 is a cathode, the second electrode of the first light emitting device 22 is an anode, the first electrode of the second light emitting device 23 is an anode, and the second electrode of the second light emitting device 23 is a cathode.

In the present embodiment, the circuit structures of the first driving circuit 21 and the second driving circuit 24 may be the same or different, which is not limited in the present embodiment. The first driving circuit 21 may be any pixel driving circuit that can drive the first light emitting device 22 to emit light, and the second driving circuit 24 may be any pixel driving circuit that can drive the second light emitting device 23 to emit light. The circuit structures of the first driving circuit 21 and the second driving circuit 24 are not limited in the present embodiment.

The first light emitting device 22 may be an organic light emitting diode device, a quantum-dot light emitting diode device and so on, which is not limited in the present embodiment.

The second light emitting device 23 may be an organic light emitting diode device, a quantum-dot light emitting diode device and so on, which is not limited in the present embodiment.

The colors of the emitted lights of the first light emitting device 22 and the second light emitting device 23 may be the same or different, which is not limited in the present embodiment.

On the condition that the first light emitting device 22 and the second light emitting device 23 reach the equal brightness, as compared with the related art, the series-connected structure according to the present embodiment can perform voltage division to the voltage between the first power-supply terminal 25 and the second power-supply terminal 26, to reduce the voltage at the two ends of the first driving circuit 21 and the first light emitting device 22, or reduce the voltage at the two ends of the second light emitting device 23 and the second driving circuit 24, which can reduce the power consumption.

Regarding the first driving transistor DT1, what decides its electric current is the source electrode voltage and the grid electrode voltage of the first driving transistor DT1. Because the source electrode of the first driving transistor DT1 is connected to the first power-supply terminal 25, the source electrode voltage of the first driving transistor DT1 is exactly the voltage inputted by the first power-supply terminal 25, and the electric current in the first driving transistor DT1 is unrelated to the voltage of the first light emitting device 22 or the second light emitting device 23; in other words, the electric current in the first light emitting device 22 is unrelated to the emitted-light brightness of the first light emitting device 22 or the second light emitting device 23.

Regarding the second driving transistor DT2, what decides its electric current is the source electrode voltage and the grid electrode voltage of the second driving transistor DT2. Because the source electrode of the second driving transistor DT2 is connected to the second power-supply terminal 26, the source electrode voltage of the second driving transistor DT2 is exactly the voltage inputted by the second power-supply terminal 26, and the electric current in the second driving transistor DT2 is unrelated to the voltage of the first light emitting device 22 or the second light emitting device 23; in other words, the electric current in the second light emitting device 23 is unrelated to the emitted-light brightness of the first light emitting device 22 or the second light emitting device 23.

In the present embodiment, because the channel types of the first driving transistor DT1 and the second driving transistor DT2 are different, it can be realized that the source electrode of the first driving transistor DT1 is connected to the first power-supply terminal 25, and the source electrode of the second driving transistor DT2 is connected to the second power-supply terminal 26. If the channel types of the first driving transistor DT1 and the second driving transistor DT2 are the same, then the electric current of one of the driving transistors is definitely influenced by the voltage of the first light emitting device 22 or the voltage of the second light emitting device 23, which results in instability of the driving current.

The pixel circuit according to the present embodiment, by connecting in series the first driving circuit, the first light emitting device, the second light emitting device and the second driving circuit between the first power-supply terminal and the second power-supply terminal, can perform voltage division to the voltage between the first power-supply terminal and the second power-supply terminal, which, in an aspect, can prevent increase of the heating quantity caused by an excessive voltage, and, in another aspect, on the condition that the first light emitting device and the second light emitting device reach the equal brightness, can realize the effect of power-consumption reduction. In addition, because the channel types of the first driving transistor and the second driving transistor are different, the source electrode of the first driving transistor is connected to the first power-supply terminal, and the source electrode of the second driving transistor is connected to the second power-supply terminal, the electric current in the first light emitting device is unrelated to the emitted-light brightness of the first light emitting device or the second light emitting device, and the electric current in the second light emitting device is unrelated to the emitted-light brightness of the first light emitting device or the second light emitting device, which can improve the stability of the driving current.

In a particular implementation, one of the first light emitting device 22 and the second light emitting device 23 may be a light emitting device that can emit a blue light, and the other is a light emitting device that can emit a green light or a red light. That may enable the first light emitting device 22 and the second light emitting device 23 to complement in terms of the driving voltages, to prevent increase of the heating quantity caused by an excessive voltage in the red-light device or the green-light device, thereby solving the problem of the conventional connecting mode that, because the cut-in voltage of the blue-light device is high, and in order to ensure the normal driving of the blue-light device, the green-light device and the red-light device connected in parallel to the blue-light device have an excessive voltage.

In the actual driving process, in order to ensure the stability of the pixel circuit, the mutually series-connected first light emitting device 22 and second light emitting device 23 may be controlled to synchronously emit light.

In order to independently control the brightness of the first light emitting device 22 and the second light emitting device 23, to prevent mutual interference between them, in an alternative implementation, referring to FIGS. 2 and 3, the pixel circuit may further include:

a bleeder component 27, connected to a first node A, wherein the first node A is connected to the second electrode of the first light emitting device 22 and the second electrode of the second light emitting device 23, so that the difference between the electric current in the first light emitting device 22 and the electric current in the second light emitting device 23 is equal to the electric current in the bleeder component 27.

Figure 5A:
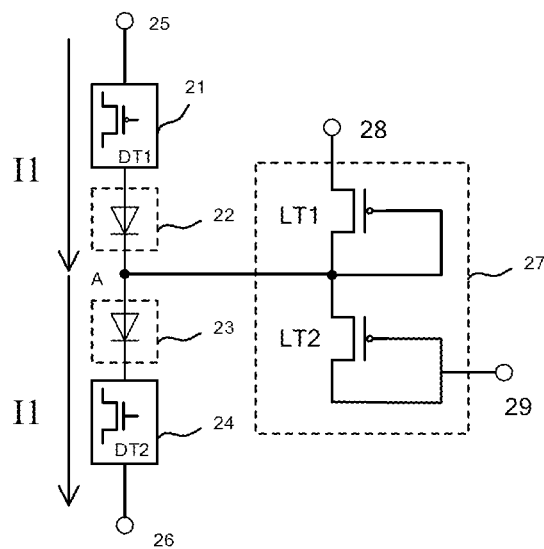
FIG. 5a schematically shows a schematic diagram of the electric-current flowing direction of a pixel circuit.
Figure 5B:
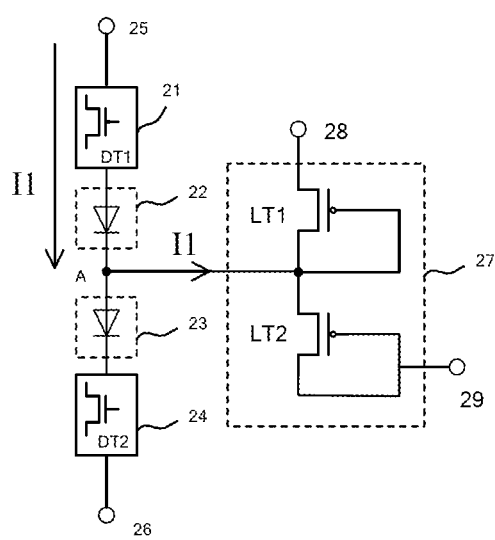
FIG. 5b schematically shows a schematic diagram of the electric-current flowing direction of another pixel circuit.

When the electric current in the first light emitting device 22 and the electric current in the second light emitting device 23 are not equal, the bleeder component 27 may serve for electric-current shunting. Referring to FIG. 5a, FIG. 5a shows a schematic diagram of the electric-current flowing direction when the electric current in the first light emitting device 22 and the electric current in the second light emitting device 23 are equal. As shown in FIG. 5a, both of the electric current in the first light emitting device 22 and the electric current in the second light emitting device 23 are I1. Referring to FIG. 5b, FIG. 5b shows a schematic diagram of the electric-current flowing direction when the electric current in the first light emitting device 22 and the electric current in the second light emitting device 23 are not equal. As shown in FIG. 5b, the electric current in the first light emitting device 22 is I1, the electric current in the second light emitting device 23 is zero, and the electric current I1 in the second light emitting device 23 flows out via the bleeder component 27.

Figure 6:
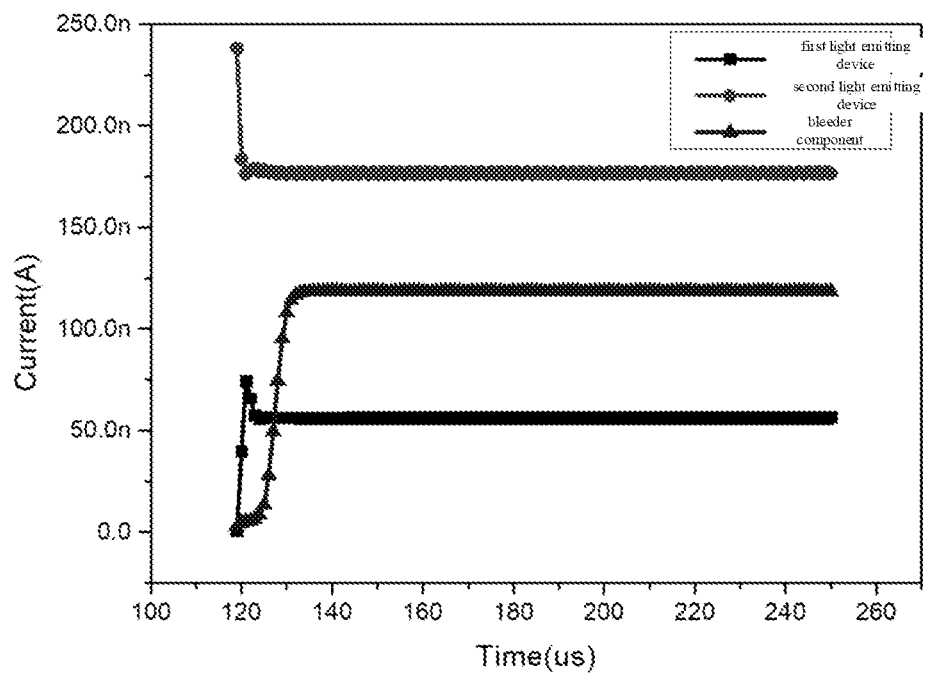
FIG. 6 schematically shows an electric-current simulating diagram of a pixel circuit.

Referring to FIG. 6, FIG. 6 shows a simulating data diagram of the electric currents in the first light emitting device 22, the second light emitting device 23 and the bleeder component 27. As shown in FIG. 6, the difference between the electric current in the first light emitting device 22 and the electric current in the second light emitting device 23 is equal to the electric current in the bleeder component 27.

In the present implementation, the bleeder component 27 serves for electric-current shunting, and may have multiple particular structures. In an alternative implementation, referring to FIG. 2 or 3, the bleeder component 27 may include a first transistor LT1 and a second transistor LT2 that have the same channel type. A first electrode of the first transistor LT1 is connected to a first voltage inputting terminal 28, and a second electrode of the first transistor LT1 and the grid electrode of the first transistor LT1 are connected to the first node A. A first electrode of the second transistor LT2 is connected to the first node A, and a second electrode of the second transistor LT2 and the grid electrode of the second transistor LT2 are connected to a second voltage inputting terminal 29.

The voltages inputted by the first voltage inputting terminal 28 and the second voltage inputting terminal 29 may be equal; for example, both of them may be a constant voltage VLE.

Both of the first transistor LT1 and the second transistor LT2 are diode-connected.

Both of the channel types of the first transistor LT1 and the second transistor LT2 may be a P type, as shown in FIGS. 2 and 3, and both may also be an N-type, which is not limited in the present embodiment.

Figure 7:
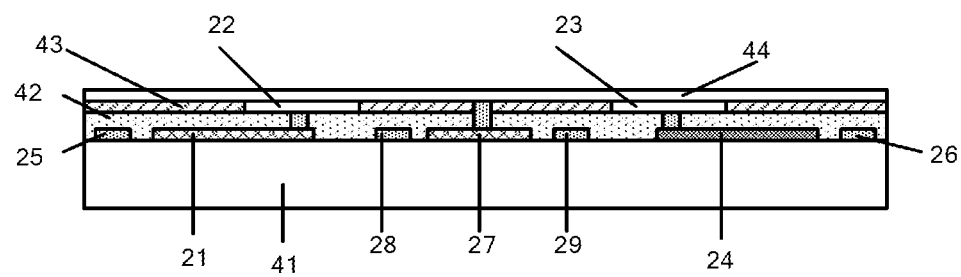
FIG. 7 schematically shows a schematic sectional structural diagram of a pixel circuit.

Referring to FIG. 7, FIG. 7 schematically shows a schematic sectional structural diagram of a pixel circuit having a bleeder component. As shown in FIG. 7, the bleeder component 27 may be disposed between the substrate 41 and the electrode layer 44, and the bleeder component 27 may be connected to the electrode layer 44 by a via hole.

As shown in FIGS. 2 and 3, when the difference between the electric current in the first light emitting device 22 and the electric current in the second light emitting device 23 is high, the voltage of the first node A increases or decreases, and the voltage difference at the two ends of the first transistor LT1 or the second transistor LT2 increases, whereby the first transistor LT1 or the second transistor LT2 is conducted, and completes the current balance together with the first driving transistor DT1 and the second driving transistor DT2, whereby finally the difference between the electric currents flowing through the first driving transistor DT1 and the second driving transistor DT2 is equal to the electric current in the first transistor LT1 or the electric current in the second transistor LT2, to enable the entire pixel circuit to reach the state of current balance.

Figure 8:
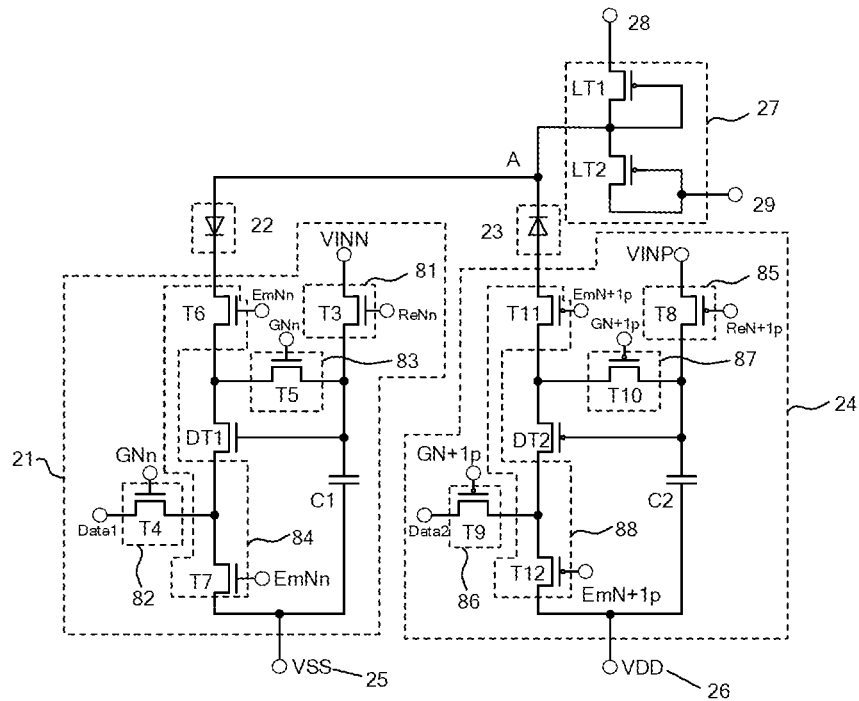
FIG. 8 schematically shows a particular schematic structural diagram of a pixel circuit.

Referring to FIG. 8, FIG. 8 schematically shows a particular schematic structural diagram of a pixel circuit. As shown in FIG. 8, the first driving circuit 21 may further include: a first capacitor C1, wherein a first electrode of the first capacitor C1 is connected to the first power-supply terminal 25, and a second electrode of the first capacitor C1 is connected to the grid electrode of the first driving transistor DT1.

As shown in FIG. 8, the first driving circuit 21 may further include: a first resetting module 81 configured for, according to a signal inputted by a first resetting controlling terminal ReNn, at a first resetting stage, transmitting a signal of a first initialized-voltage terminal VINN to the grid electrode of the first driving transistor DT1 and the second electrode of the first capacitor C1.

As shown in FIG. 8, the first driving circuit 21 may further include: a first writing module 82 configured for, according to a signal inputted by a first scanning-signal terminal GNn, at a first writing stage, writing a data signal of a first data writing terminal Data1 into the source electrode of the first driving transistor DT1.

As shown in FIG. 8, the first driving circuit 21 may further include: a first compensating module 83 configured for, according to a signal inputted by a first scanning-signal terminal GNn, at the first writing stage, conducting the drain electrode of the first driving transistor DT1 with the grid electrode of the first driving transistor DT1.

As shown in FIG. 8, the first driving circuit 21 may further include: a first light-emission controlling module 84 configured for, according to a signal inputted by a first light-emission controlling terminal EmNn, at the first resetting stage and the first writing stage, disconnecting the source electrode of the first driving transistor DT1 from the first power-supply terminal 25, and disconnecting the drain electrode of the first driving transistor DT1 from the first electrode of the first light emitting device 22, and, at a light-emission stage, conducting the source electrode of the first driving transistor DT1 with the first power-supply terminal 25, and conducting the drain electrode of the first driving transistor DT1 with the first electrode of the first light emitting device 22.

As shown in FIG. 8, the second driving circuit 24 may further include: a second capacitor C2, wherein a first electrode of the second capacitor C2 is connected to the second power-supply terminal 26, and a second electrode of the second capacitor C2 is connected to the grid electrode of the second driving transistor DT2.

As shown in FIG. 8, the second driving circuit 24 may further include: a second resetting module 85 configured for, according to a signal inputted by a second resetting controlling terminal ReN+1p, at a second resetting stage, transmitting a signal of a second initialized-voltage terminal VINP to the grid electrode of the second driving transistor DT2 and the second electrode of the second capacitor C2.

As shown in FIG. 8, the second driving circuit 24 may further include: a second writing module 86 configured for, according to a signal inputted by a second scanning-signal terminal GN+1p, at a second writing stage, writing a data signal of a second data writing terminal Data2 into the source electrode of the second driving transistor DT2.

As shown in FIG. 8, the second driving circuit 24 may further include: a second compensating module 87 configured for, according to a signal inputted by a second scanning-signal terminal GN+1p, at the second writing stage, conducting the drain electrode of the second driving transistor DT2 with the grid electrode of the second driving transistor DT2.

As shown in FIG. 8, the second driving circuit 24 may further include: a second light-emission controlling module 88 configured for, according to a signal inputted by a second light-emission controlling terminal EmN+1p, at the second resetting stage and the second writing stage, disconnecting the source electrode of the second driving transistor DT2 from the second power-supply terminal 26, and disconnecting the drain electrode of the second driving transistor DT2 from the first electrode of the second light emitting device 23, and, at the light-emission stage, conducting the source electrode of the second driving transistor DT2 with the second power-supply terminal 26, and conducting the drain electrode of the second driving transistor DT2 with the first electrode of the second light emitting device 23.

In the present implementation, the circuit structures of the first driving circuit 21 and the second driving circuit 24 are the same.

As shown in FIG. 8, the voltage signal inputted by the first power-supply terminal 25 may be the low-level signal VSS, the voltage signal inputted by the second power-supply terminal 26 may be the high-level signal VDD, the channel type of the first driving transistor DT1 is an N type, the channel type of the second driving transistor DT2 is a P type, the first electrode of the first light emitting device 22 is a cathode, the second electrode of the first light emitting device 22 is an anode, the first electrode of the second light emitting device 23 is an anode, and the second electrode of the second light emitting device 23 is a cathode.

As shown in FIG. 8, the first resetting module SI may include a third transistor T3, the grid electrode of the third transistor T3 is connected to the first resetting controlling terminal ReNn, a first electrode of the third transistor T3 is connected to the first initialized-voltage terminal VINN, and a second electrode of the third transistor T3 is connected to the grid electrode of the first driving transistor DT1 and a second electrode of the first capacitor C1.

The first writing module 82 may include a fourth transistor T4, the grid electrode of the fourth transistor T4 is connected to the first scanning-signal terminal GNn, a first electrode of the fourth transistor T4 is connected to the first data writing terminal Data1, and a second electrode of the fourth transistor T4 is connected to the source electrode of the first driving transistor DT1.

The first compensating module 83 may include a fifth transistor T5, the grid electrode of the fifth transistor T5 is connected to the first scanning-signal terminal GNn, a first electrode of the fifth transistor T5 is connected to the grid electrode of the first driving transistor DT1, and a second electrode of the fifth transistor T5 is connected to the drain electrode of the first driving transistor DT1.

The first light-emission controlling module 84 may include a sixth transistor T6 and a seventh transistor T7. The grid electrode of the sixth transistor T6 is connected to the first light-emission controlling terminal EmNn, a first electrode of the sixth transistor T6 is connected to the drain electrode of the first driving transistor DT1, and a second electrode of the sixth transistor T6 is connected to the first electrode of the first light emitting device 22. The grid electrode of the seventh transistor T7 is connected to the first light-emission controlling terminal EmNn, the first electrode of the seventh transistor T7 is connected to the source electrode of the first driving transistor DT1, and a second electrode of the seventh transistor T7 is connected to the first power-supply terminal 25.

The second resetting module 85 may include an eighth transistor T8, the grid electrode of the eighth transistor T8 is connected to the second resetting controlling terminal ReN+1p, a first electrode of the eighth transistor T8 is connected to the second initialized-voltage terminal VINP, and a second electrode of the eighth transistor T8 is connected to the grid electrode of the second driving transistor DT2 and the second electrode of the second capacitor C2.

The second writing module 86 may include a ninth transistor T9, the grid electrode of the ninth transistor T9 is connected to the second scanning-signal terminal GN+1p, a first electrode of the ninth transistor T9 is connected to the second data writing terminal Data2, and a second electrode of the ninth transistor T9 is connected to the source electrode of the second driving transistor DT2.

The second compensating module 87 may include a tenth transistor T10, the grid electrode of the tenth transistor T10 is connected to the second scanning-signal terminal GN+1p, a first electrode of the tenth transistor T10 is connected to the grid electrode of the second driving transistor DT2, and a second electrode of the tenth transistor T10 is connected to the drain electrode of the second driving transistor DT2.

The second light-emission controlling module 88 may include an eleventh transistor T11 and a twelfth transistor T12. The grid electrode of the eleventh transistor T11 is connected to the second light-emission controlling terminal EmN+1p, a first electrode of the eleventh transistor T11 is connected to the drain electrode of the second driving transistor DT2, and a second electrode of the eleventh transistor T11 is connected to a first electrode of the second light emitting device 23. The grid electrode of the seventh transistor T7 is connected to the second light-emission controlling terminal EmN+1p, the first electrode of the seventh transistor T7 is connected to the source electrode of the second driving transistor DT2, and the second electrode of the seventh transistor T7 is connected to the second power-supply terminal 26.

In a particular implementation, the channel types of the third transistor T3, the fourth transistor T4, the fifth transistor T5, the sixth transistor T6, the seventh transistor T7, the eighth transistor T8, the ninth transistor T9, the tenth transistor T10, the eleventh transistor T11 and the twelfth transistor T12 may be any one of an N-type or a P type. The present implementation takes the case as an example for the description in which the channel types of the third transistor T3, the fourth transistor T4, the fifth transistor T5, the sixth transistor T6 and the seventh transistor T7 are an N-type and the channel types of the eighth transistor T8, the ninth transistor T9, the tenth transistor T10, the eleventh transistor T11 and the twelfth transistor T12 are a P type, as shown in FIG. 8.

Figure 9:
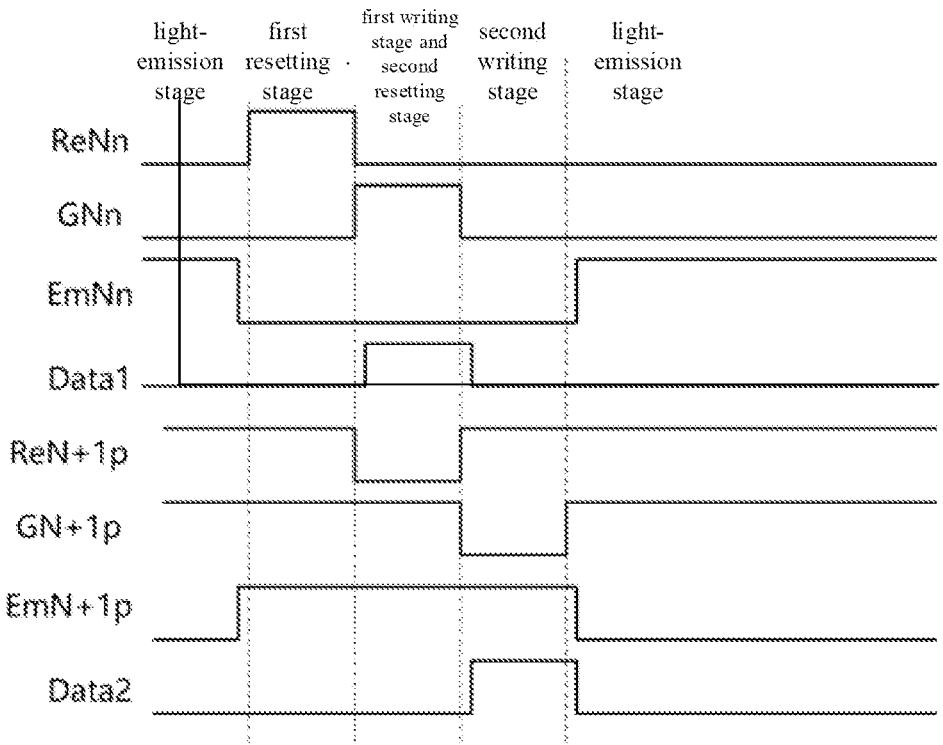
FIG. 9 schematically shows a sequence diagram of the signal inputting of the input terminals of a pixel circuit.
Figure 10A:
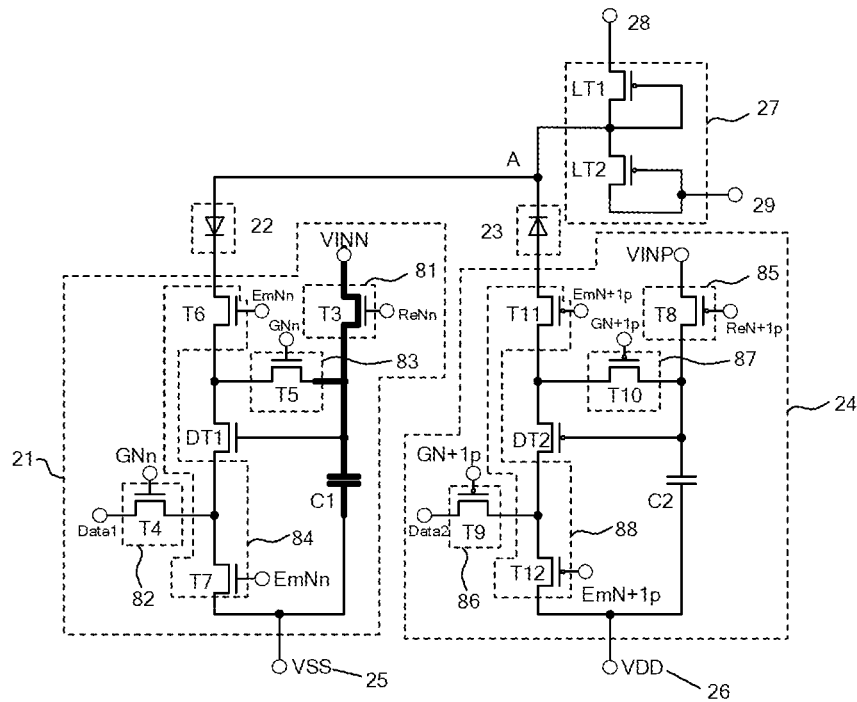
FIG. 10a schematically shows a schematic diagram of the electric-circuit state of a pixel circuit at the first resetting stage.
Figure 10B:
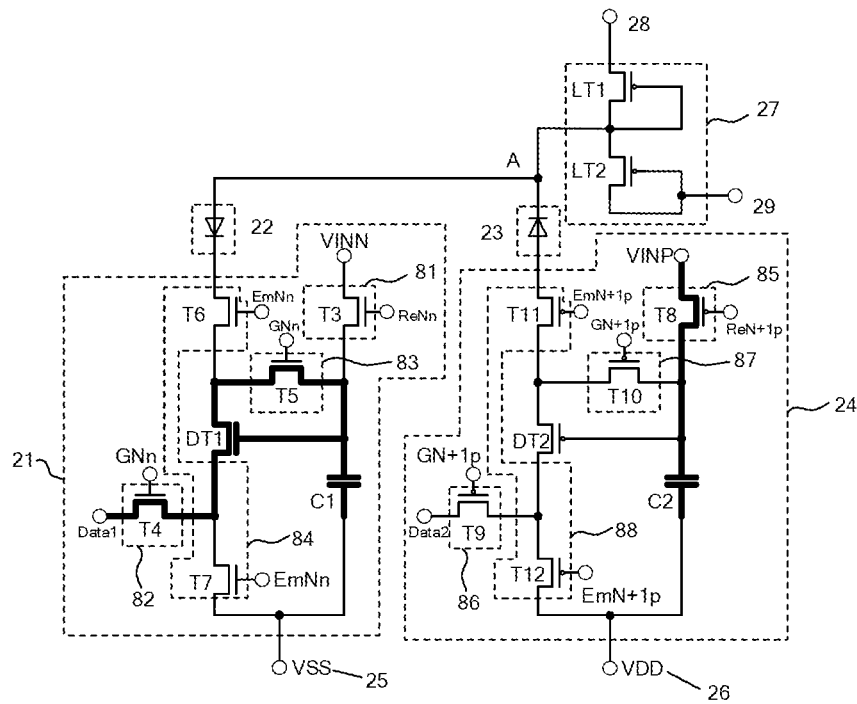
FIG. 10b schematically shows a schematic diagram of the electric-circuit state of a pixel circuit at the first writing stage and the second resetting stage.
Figure 10C:
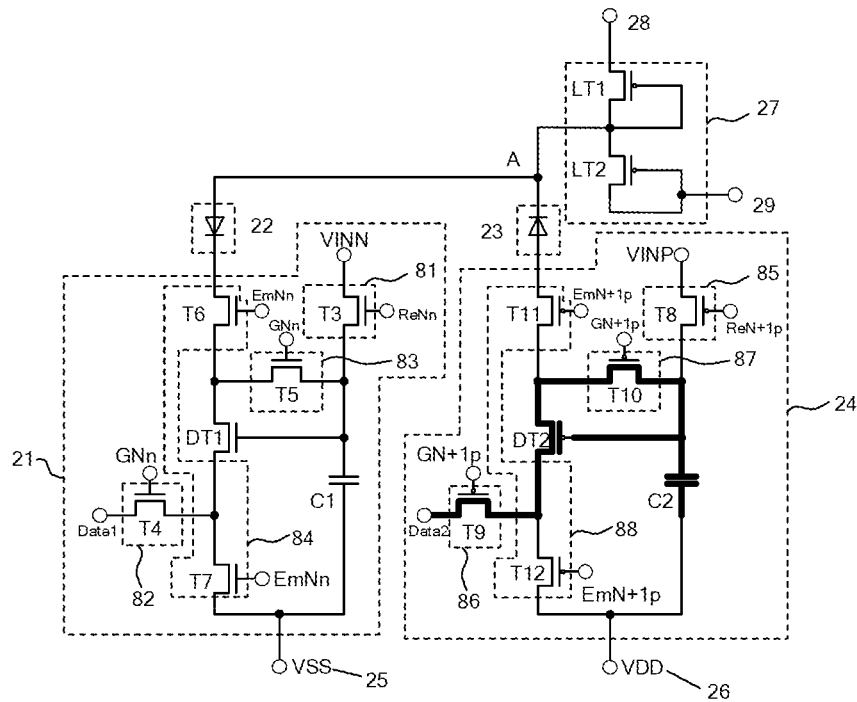
FIG. 10c schematically shows a schematic diagram of the electric-circuit state of a pixel circuit at the second writing stage.
Figure 10D:
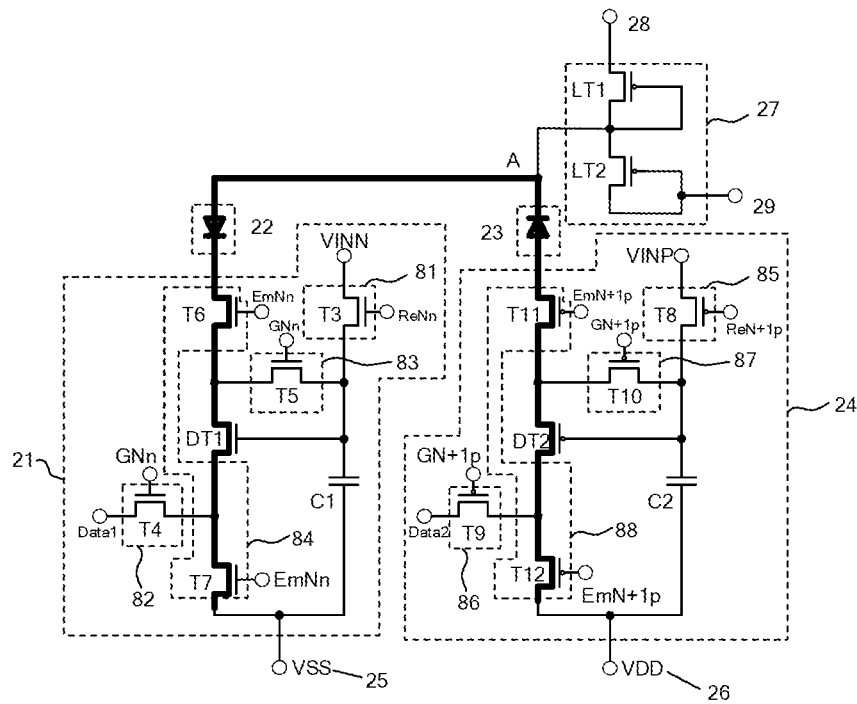
FIG. 10d schematically shows a schematic diagram of the electric-circuit state of a pixel circuit at the light-emission stage.

Assuming that, in FIG. 8, the first light emitting device 22 is located at the N-th row in the light emitting base plate, and the second light emitting device 23 is located at the (N+1)-th row in the light emitting base plate, referring to FIG. 9, FIG. 9 shows a sequence diagram of the signal inputting of the input terminals of the pixel circuit shown in FIG. 8. Referring to FIG. 10. FIG. 10 shows a schematic diagram of the electric-circuit conduction state of the stages shown in FIG. 9. The bolded lines and devices in FIG. 10 indicate that an electric current passes. The particular driving process may include:

at the first resetting stage, as shown in FIG. 10a, controlling the signal of the first initialized-voltage terminal VINN to be transmitted to the grid electrode of the first driving transistor DT1 and the second electrode of the first capacitor C1, controlling the source electrode of the first driving transistor DT1 to be disconnected from the first power-supply terminal 25, and controlling the drain electrode of the first driving transistor DT1 to be disconnected from the first electrode of the first light emitting device 22;

at the first writing stage, as shown in FIG. 10b, controlling the data signal of the first data writing terminal Data1 to be written into the source electrode of the first driving transistor DT1, controlling the drain electrode of the first driving transistor DT1 to be conducted with the grid electrode of the first driving transistor DT1, controlling the source electrode of the first driving transistor DT1 to be disconnected from the first power-supply terminal 25, and controlling the drain electrode of the first driving transistor DT1 to be disconnected from the first electrode of the first light emitting device 22;

at the second resetting stage, as shown in FIG. 10b, controlling the signal of the second initialized-voltage terminal VINP to be transmitted to the grid electrode of the second driving transistor DT2 and the second electrode of the second capacitor C2, controlling the source electrode of the second driving transistor DT2 to be disconnected from the second power-supply terminal 26, and controlling the drain electrode of the second driving transistor DT2 to be disconnected from the first electrode of the second light emitting device 23;

at the second writing stage, as shown in FIG. 10c, controlling the data signal of the second data writing terminal Data2 to be written into the source electrode of the second driving transistor DT2, controlling the drain electrode of the second driving transistor DT2 to be conducted with the grid electrode of the second driving transistor DT2, controlling the source electrode of the second driving transistor DT2 to be disconnected from the second power-supply terminal 26, and controlling the drain electrode of the second driving transistor DT2 to be disconnected from the first electrode of the second light emitting device 23; and at the light-emission stage, as shown in FIG. 10d, controlling the source electrode of the first driving transistor DT1 to be conducted with the first power-supply terminal 25, controlling the drain electrode of the first driving transistor DT1 to be conducted with the first electrode of the first light emitting device 22, controlling the source electrode of the second driving transistor DT2 to be conducted with the second power-supply terminal 26, and controlling the drain electrode of the second driving transistor DT2 to be conducted with the first electrode of the second light emitting device 23. The first light emitting device 22 and the second light emitting device 23 synchronously emit light at the light-emission stage.

The second resetting stage and the first writing stage may proceed synchronously.

In order that the first light emitting device 22 and the second light emitting device 23 synchronously emit light at the light-emission stage, the signals inputted by the first light-emission controlling terminal EmNn and the second light-emission controlling terminal EmN+1p may be controlled to have the same width and switching time.

At the light-emission stage, the driving current $I_1$ in the first light emitting device 22 is:

$I_1=\beta \times (Vdata1+Vth1-VSS-Vth1)^2$, wherein Vdata1 is the data signal inputted by the first data writing terminal Data1, Vth1 is the threshold voltage of the first driving transistor DT1, and VSS is the voltage inputted by the first power-supply terminal 25.

The driving current $I_2$ in the second light emitting device 23 is:

$I_2=\beta \times (Vdata2+Vth2-VDD-Vth2)^2$, wherein Vdata2 is the data signal inputted by the second data writing terminal Data2, Vth2 is the threshold voltage of the second driving transistor DT2, and VDD is the voltage inputted by the second power-supply terminal 26.

In the driving process, the first light-emission controlling terminal EmNn and the second light-emission controlling terminal EmN+1p are required to shut off the first light-emission controlling module 84 and the second light-emission controlling module 88 before the first resetting controlling terminal ReNn and the second resetting controlling terminal ReN+1p input effective resetting signals, and turn on the first light-emission controlling module 84 and the second light-emission controlling module SS after the scanning signals inputted by the first scanning-signal terminal GNn and the second scanning-signal terminal GN+1p are ineffective, as shown in FIG. 9.

The shutting off the first light-emission controlling module 84 refers to disconnecting the source electrode of the first driving transistor DT1 from the first power-supply terminal 25, and disconnecting the drain electrode of the first driving transistor DT1 from the first electrode of the first light emitting device 22. The turning on the first light-emission controlling module 84 refers to conducting the source electrode of the first driving transistor DT1 with the first power-supply terminal 25, and conducting the drain electrode of the first driving transistor DT1 with the first electrode of the first light emitting device 22.

The shutting off the second light-emission controlling module 88 refers to disconnecting the source electrode of the second driving transistor DT2 from the second power-supply terminal 26, and disconnecting the drain electrode of the second driving transistor DT2 from the first electrode of the second light emitting device 23. The turning on the second light-emission controlling module 88 refers to conducting the source electrode of the second driving transistor DT2 with the second power-supply terminal 26, and conducting the drain electrode of the second driving transistor DT2 with the first electrode of the second light emitting device 23.

An embodiment of the present disclosure provides a light emitting base plate, wherein the light emitting base plate includes the pixel circuit according to any one of the above embodiments.

In the present embodiment, the light emitting base plate may be used for illumination, i.e., applied to an illuminating device, and may also be used for displaying, i.e., applied to a light emitting device.

Referring to FIGS. 11 to 16, FIGS. 11 to 16 show schematic planar structural diagrams of several light emitting base plates. As shown in FIGS. 1l to 16, the light emitting base plate may include a plurality of pixel units 110. The plurality of pixel units 110 may be arranged in an array.

Figure 11:
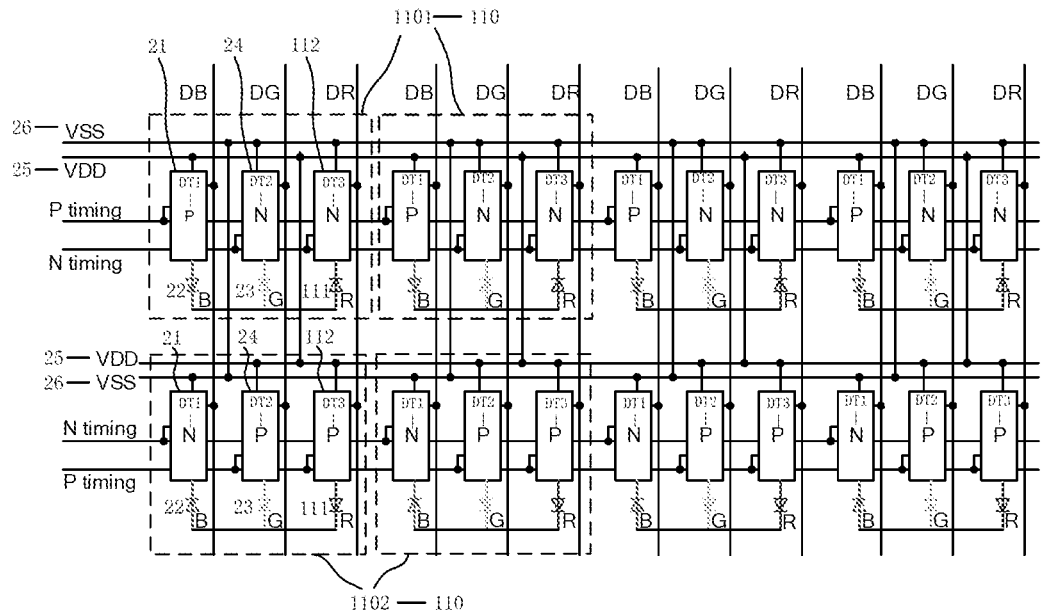
FIG. 11 schematically shows a schematic structural diagram of the first type of the light emitting base plate.
Figure 12:
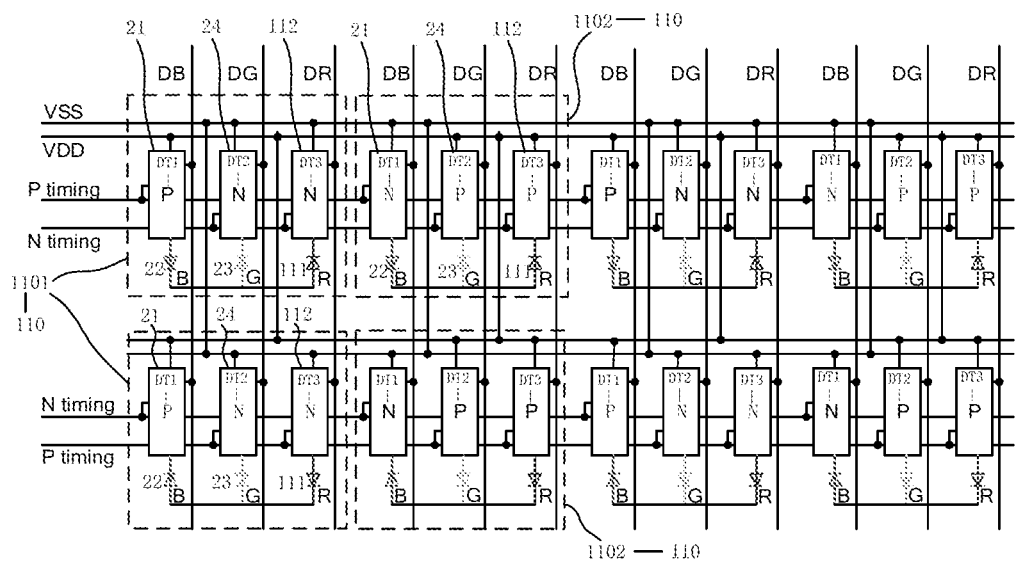
FIG. 12 schematically shows a schematic structural diagram of the second type of the light emitting base plate.
Figure 13:
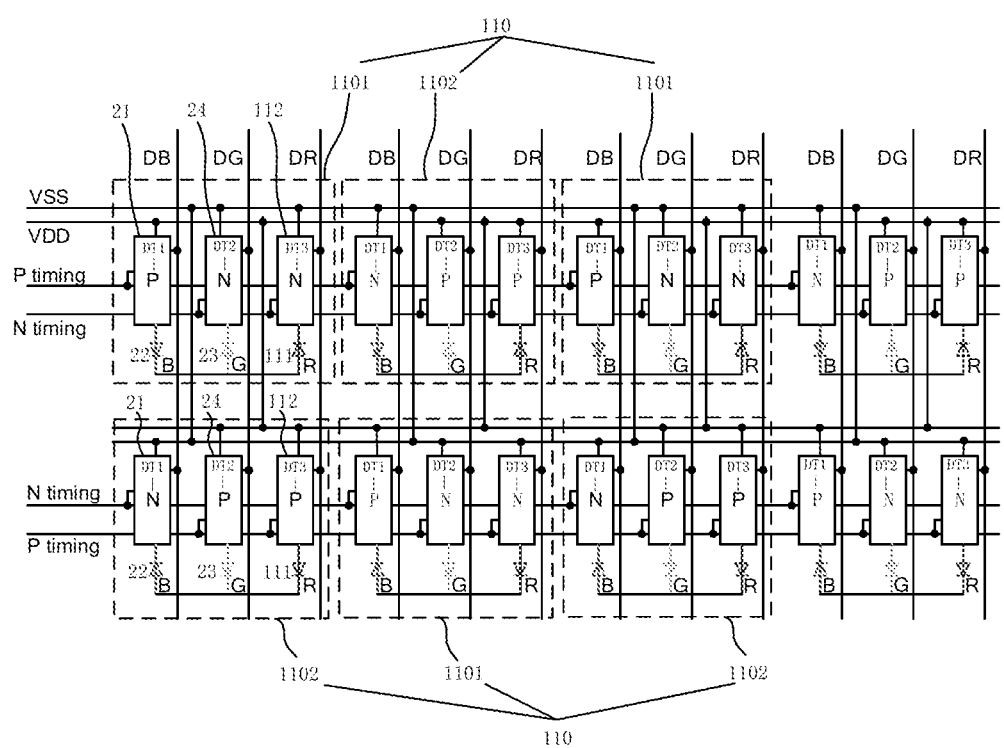
FIG. 13 schematically shows a schematic structural diagram of the third type of the light emitting base plate.

In an alternative implementation, as shown in FIGS. 11 to 13, the first light emitting device 22 and the second light emitting device 23 may be located in the same pixel unit 110. Particularly, one pixel unit 110 may include a plurality of sub-pixel units of different colors, for example a red-color sub-pixel unit R, a blue-color sub-pixel unit B and a green-color sub-pixel unit G, and the first light emitting device 22 and the second light emitting device 23 may be located at the sub-pixel units of different colors in the same pixel unit 110. In the present implementation, the first light emitting device 22 and the second light emitting device 23 may emit lights of different colors.

As shown in FIGS. 11 to 13, in the same one above-described pixel unit 110, the pixel circuit may further include a third light emitting device 111 and a third driving circuit 112.

In a particular implementation, the first light emitting device 22, the second light emitting device 23 and the third light emitting device 111 may be located at the sub-pixel units of different colors in the same pixel unit 110.

The third driving circuit 112 may include a third driving transistor DT3, the source electrode of the third driving transistor is connected to the second power-supply terminal 26, and the drain electrode of the third driving transistor DT3 is connected to a first electrode of the third light emitting device 111.

A second electrode of the third light emitting device 111 is connected to the second electrode of the first light emitting device 22 and the second electrode of the second light emitting device 23.

The channel type of the third driving transistor DT3 and the channel type of the second driving transistor DT2 are the same.

The third driving circuit 112 may have a circuit structure the same as or different from the circuit structures of the first driving circuit 21 and the second driving circuit 24, which is not limited in the present embodiment.

It should be noted that, in FIGS. 11 to 16, DT1-P represents that the channel type of the first driving transistor DT1 is a P type, DT1-N represents that the channel type of the first driving transistor DT1 is an N type, DT2-P represents that the channel type of the second driving transistor DT2 is a P type, DT2-N represents that the channel type of the second driving transistor DT2 is an N type, DT3-P represents that the channel type of the third driving transistor DT3 is a P type, and DT3-N represents that the channel type of the third driving transistor DT3 is an N type.

As shown in FIGS. 11 to 13, in a certain pixel unit 110, when the first driving transistor DT1 is of a P type, the third driving transistor DT3 and the second driving transistor DT2 are of an N type, and when the first driving transistor DT1 is of an N type, the third driving transistor DT3 and the second driving transistor DT2 are of a P type.

As shown in FIGS. 11 to 13, the first driving circuit 21 and the first light emitting device 22 form a first branch circuit, the second driving circuit 24 and the second light emitting device 23 form a second branch circuit, and the third driving circuit 112 and the third light emitting device 111 form a third branch circuit, wherein the second branch circuit and the first branch circuit are connected in series, and the second branch circuit and the third branch circuit are connected in parallel.

Because, in the process of normal driving, the driving current of the blue-light device is approximately equal to the sum of the driving currents of the green-light device and the red-light device, the first light emitting device 22 may be a light emitting device capable of emitting a blue light, the second light emitting device 23 may be a light emitting device capable of emitting a green light, and the third light emitting device 111 may be a light emitting device capable of emitting a red light. That can enable the total current in the driving transistors in the pixel circuit whose channel types are a P type to be close to the total current in the driving transistors whose channel types are an N type, which facilitates the controlling on the white balance, and can ensure the current balance in the displaying of the frames of the colors such as yellow, cyan, violet, green, red and blue.

As shown in FIGS. 11 to 13, taking the case as an example in which the channel type of the first driving transistor DT1 is a P type, and the channel types of the third driving transistor DT3 and the second driving transistor DT2 are an N type, the driving voltage corresponding to one pixel unit 110 is:

$$VDD-VSS=VTFT+VTFT+VQLED+VQLED,$$

wherein VTFT is the voltage of the first driving transistor DT1 of the P type, VTFT is the voltage of the second driving transistor DT2 of the N type, VQLED is the voltage of the second light emitting device 23 (the red-light device), and VQLED is the voltage of the first light emitting device 22 (the blue-light device). It should be noted that the above driving voltages have neglected the voltages of the switching transistors other than the driving transistors in the driving circuit.

The power consumption corresponding to the pixel unit 110 is:

$$P1=I_{BQLED} \times (VDD-VSS)=I_{BQLED} \times (VTFT_p+VTFT_n+VQLED_R+VQLED_B),$$

wherein $I_{BQLED}$ is the electric current of the first light emitting device 22 (the blue-light device).

As a comparison, in the related art, the power consumption of one pixel unit as shown in FIG. 1 is:

$$P2=(I_{BQLED}+I_{GQLED}+I_{RQLED}) \times (VTFT_p+VQLED_B),$$

wherein $I_{BQLED}$ is the electric current of the blue-light device, $I_{GQLED}$ is the electric current of the green-light device, $I_{RQLED}$ is the electric current of the red-light device, $VTFT_p$ is the voltage of the pixel driving circuit 11 in FIG. 1, and $VTFT_B$ is the voltage of the light emitting device 12 in FIG. 1.

Generally, $VTFT_p$ is approximately equal to $VTFT_n$, $I_{BQLED}$ is approximately equal to $I_{GQLED}+I_{RQLED}$, and it is calculated that $P2-P1=2*VQLED_B-(VQLED_R+VQLED_B)$. because the voltage of the blue-light device is greater than the voltage of the red-light device, i.e., $VQLED_B > VQLED_R$, the power consumption P2 of one pixel unit shown in FIG. 1 is greater than the power consumption P1 of one pixel unit shown in FIGS. 11 to 13. Therefore, the pixel circuit according to the present disclosure can reduce the power consumption.

In addition, because both of the first power-supply terminal 25 and the second power-supply terminal 26 are a metal trace, and the pixel circuit according to the present disclosure can reduce the power consumption, the electric currents in those metal traces are reduced, whereby the voltage drops on the metal traces are reduced, thereby facilitating to improve the brightness uniformity of the light emitting base plate.

In a type of the light emitting base plate, the plurality of pixel units 110 may include a first pixel unit 1101. The first pixel unit 1101, as shown in FIGS. 11 to 13, includes a first light emitting device 22, a second light emitting device 23 and a third light emitting device 111. In the first pixel unit 1101, the channel type of the first driving transistor DT1 is a P type, the channel type of the second driving transistor DT2 and the channel type of the third driving transistor DT3 are an N type, the first electrode of the first light emitting device 22 is an anode, the first electrode of the second light emitting device 23 and the first electrode of the third light emitting device 111 are a cathode, and the voltage inputted by the first power-supply terminal 25 is greater than the voltage inputted by the second power-supply terminal 26. The second electrode of the first light emitting device 22 is a cathode, and the second electrode of the second light emitting device 23 and the second electrode of the third light emitting device 111 are an anode. The voltage signal inputted by the first power-supply terminal 25 may be the high-level signal VDD, and the voltage signal inputted by the second power-supply terminal 26 may be the low-level signal VSS. Optionally, the pixel units 110 of the light emitting base plate are the first pixel unit 1101.

In another type of the light emitting base plate, the plurality of pixel units 110 may include a second pixel unit 1102. The second pixel unit 1102, as shown in FIGS. 11 to 13, includes a first light emitting device 22, a second light emitting device 23 and a third light emitting device 111. In the second pixel unit 1102, the channel type of the first driving transistor DT1 is an N type, the channel type of the second driving transistor DT2 and the channel type of the third driving transistor DT3 are a P type, the first electrode of the first light emitting device 22 is a cathode, the first electrode of the second light emitting device 23 and the first electrode of the third light emitting device 111 are an anode, and the voltage inputted by the first power-supply terminal 25 is less than the voltage inputted by the second power-supply terminal 26. The second electrode of the first light emitting device 22 is an anode, and the second electrodes of the second light emitting device 23 and the third light emitting device 111 are a cathode. The voltage signal inputted by the first power-supply terminal 25 may be the low-level signal VSS, and the voltage signal inputted by the second power-supply terminal 26 may be the high-level signal VDD. Optionally, the pixel units 110 of the light emitting base plate are the second pixel unit 1102.

In yet another type of the light emitting base plate, referring to FIGS. 11 to 13, the plurality of pixel units 110 may include the first pixel unit 1101 stated above and the second pixel unit 1102 stated above, as shown in FIGS. 11 to 13.

When the plurality of pixel units 110 include the first pixel unit 1101 and the second pixel unit 1102, the first pixel unit 1101 and the second pixel unit 1102 may be located at different scanning lines of two neighboring scanning lines, as shown in FIG. 11.

For example, when the first pixel unit 1101 is located at a first scanning line, the second pixel unit 1102 is located at a neighboring second scanning line of the first scanning line. At least one of the pixel units in the first scanning line is the first pixel unit 1101, and at least one of the pixel units in the second scanning line is the second pixel unit 1102. Optionally, the pixel units in the first scanning line are the first pixel unit 1101, and the pixel units in the second scanning line are the second pixel unit 1102, as shown in FIG. 11.

When the plurality of pixel units 110 include the first pixel unit 1101 and the second pixel unit 1102, the first pixel unit 1101 and the second pixel unit 1102 are located at different data columns of two neighboring data columns, as shown in FIG. 12.

For example, when the first pixel unit 1101 is located at a first data column, the second pixel unit 1102 is located at a neighboring second data column of the first data column. At least one of the pixel units in the first data column is the first pixel unit 1101, and at least one of the pixel units in the second data column is the second pixel unit 1102. Optionally, the pixel units in the first data column are the first pixel unit 1101, and the pixel units in the second data column are the second pixel unit 1102, as shown in FIG. 12.

When the plurality of pixel units 110 include the first pixel unit 1101 and the second pixel unit 1102, at least one of the neighboring pixel units 110 of the first pixel unit 1101 is the second pixel unit 1102, and at least one of the neighboring pixel units 110 of the second pixel unit 1102 is the first pixel unit 1101, as shown in FIG. 13.

Optionally, the neighboring pixel units 110 of the first pixel unit 1101 may be the second pixel unit 1102, and the neighboring pixel units 110 of the second pixel unit 1102 may be the first pixel unit 1101, as shown in FIG. 13.

Figure 14:
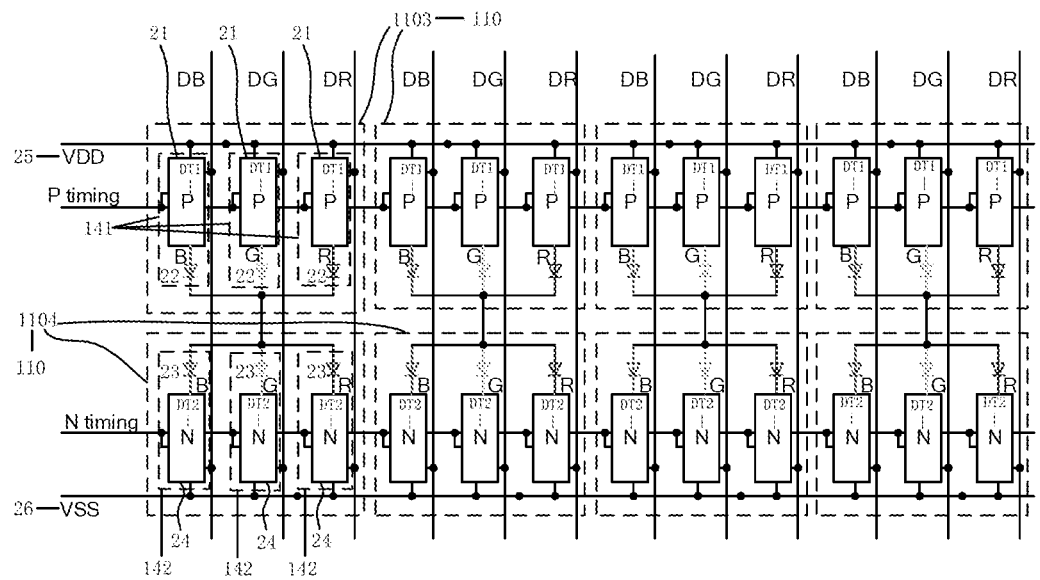
FIG. 14 schematically shows a schematic structural diagram of the fourth type of the light emitting base plate.
Figure 15:
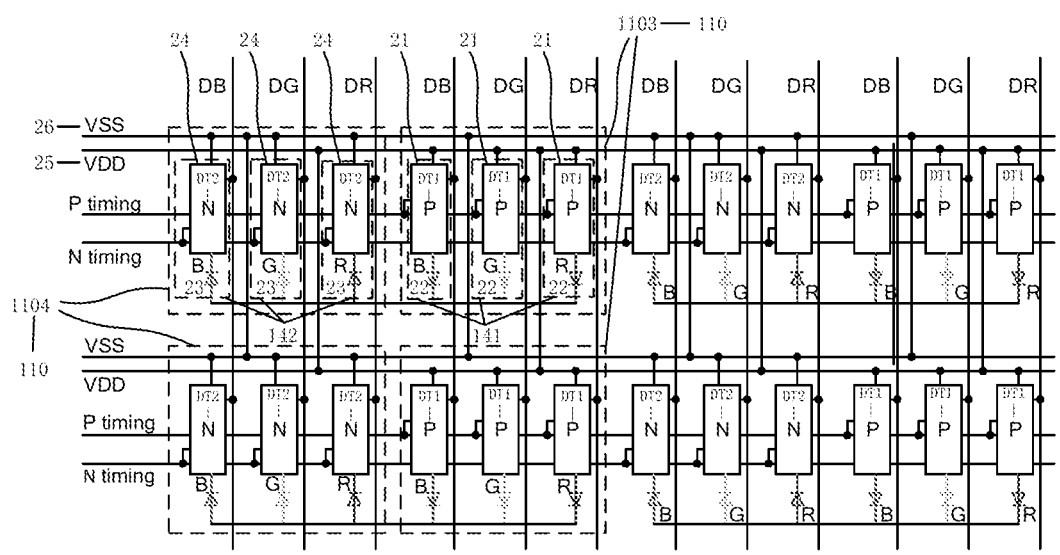
FIG. 15 schematically shows a schematic structural diagram of the fifth type of the light emitting base plate.
Figure 16:
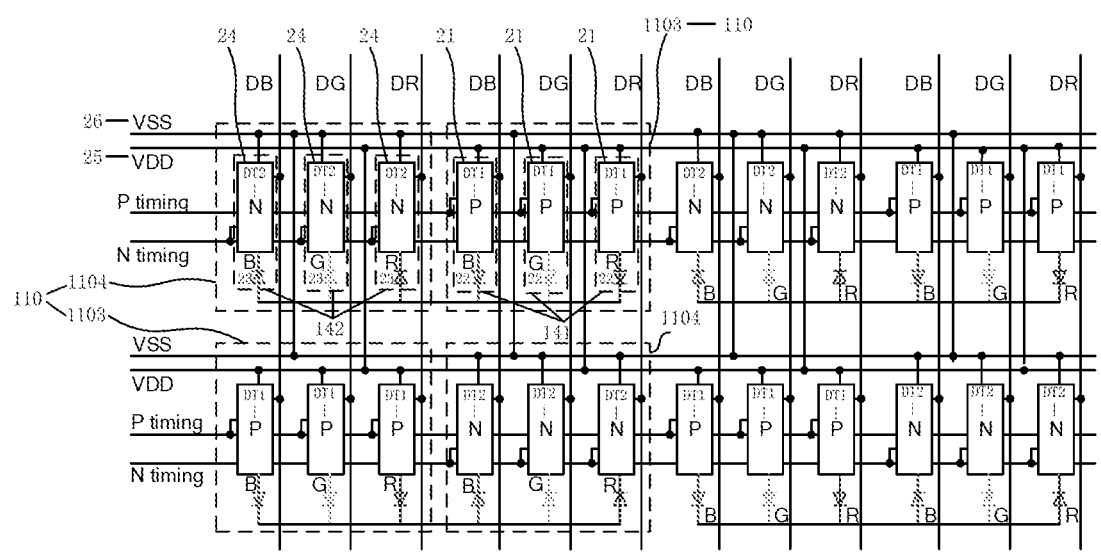
FIG. 16 schematically shows a schematic structural diagram of the sixth type of the light emitting base plate.

In another alternative implementation, as shown in FIGS. 14 to 16, the first light emitting device 22 and the second light emitting device 23 may be located in different pixel units 110. If the plurality of pixel units 110 include a third pixel unit 1103 and a fourth pixel unit 1104, then the first light emitting device 22 is located in the third pixel unit 1103, and the second light emitting device 23 is located in the fourth pixel unit 1104. The third pixel unit 1103 and the fourth pixel unit 1104 are different pixel units.

Optionally, the third pixel unit 1103 includes one or more first sub-pixel units 141, each of the first sub-pixel units 141 is provided with one first light emitting device 22 and one first driving circuit 21, and the first light emitting devices 22 in different first sub-pixel units 141 are different.

The fourth pixel unit 1104 includes one or more second sub-pixel units 142, each of the second sub-pixel units 142 is provided with one second light emitting device 23 and one second driving circuit 24, and the second light emitting devices 23 in different second sub-pixel units 142 are different.

The second electrode of any one of the first light emitting devices 22 of the third pixel units 1103 is connected to the second electrodes of the second light emitting devices 23 of the fourth pixel units 1104.

Particularly, one pixel unit 110 may include a plurality of sub-pixel units of different colors, for example a red-color sub-pixel unit R, a blue-color sub-pixel unit B and a green-color sub-pixel unit G. As shown in FIGS. 14 to 16, the first sub-pixel unit 141 is a sub-pixel unit in the third pixel unit 1103, and the second sub-pixel unit 142 is a sub-pixel unit in the fourth pixel unit 1104.

As shown in FIGS. 14 to 16, the third pixel unit 1103 includes three first sub-pixel units 141, wherein the first light emitting device 22 in one of the first sub-pixel units 141 can emit a red light, the first light emitting device 22 in one of the first sub-pixel units 141 can emit a green light, and the first light emitting device 22 in one of the first sub-pixel units 141 can emit a blue light.

As shown in FIGS. 14 to 16, the fourth pixel unit 1104 includes three second sub-pixel units 142, wherein the second light emitting device 23 in one of the second sub-pixel units 142 can emit a red light, the second light emitting device 23 in one of the second sub-pixel units 142 can emit a green light, and the second light emitting device 23 in one of the second sub-pixel units 142 can emit a blue light.

As shown in FIGS. 14 to 16, one first light emitting device 22 and one first driving circuit 21 in the first sub-pixel unit 141 form a first branch circuit, one second light emitting device 23 and one second driving circuit 24 in the second sub-pixel unit 142 form a second branch circuit, the three first branch circuits in the third pixel unit 1103 are connected in parallel, the three second branch circuits in the fourth pixel unit 1104 are connected in parallel, and the three parallel-connected first branch circuits and the three parallel-connected second branch circuits are connected in series.

The third pixel unit 1103 and the fourth pixel unit 1104 may be two neighboring pixel units 110. Optionally, the third pixel unit 1103 and the fourth pixel unit 1104 may be located at different scanning lines of two neighboring scanning lines, as shown in FIG. 14.

For example, when the third pixel unit 1103 is located at a third scanning line, the fourth pixel unit 1104 is located at a neighboring fourth scanning line of the third scanning line. At least one of the pixel units in the third scanning line is the third pixel unit 1103, and at least one of the pixel units in the fourth scanning line is the fourth pixel unit 1104. Optionally, the pixel units in the third scanning line are the third pixel units 1103, and the pixel units in the fourth scanning line are the fourth pixel units 1104, as shown in FIG. 14.

The third pixel unit 1103 and the fourth pixel unit 1104 may be two neighboring pixel units 110. Optionally, the third pixel unit 1103 and the fourth pixel unit 1104 may be located at different data columns of two neighboring data columns, as shown in FIG. 15.

For example, when the third pixel unit 1103 is located at a third data column, the fourth pixel unit 1104 is located at a neighboring fourth data column of the third data column. At least one of the pixel units in the third data column is the third pixel unit 1103, and at least one of the pixel units in the fourth data column is the fourth pixel unit 1104. Optionally, the pixel units in the third data column are the third pixel units 1103, and the pixel units in the fourth data column are the fourth pixel units 1104, as shown in FIG. 15.

That the third pixel unit 1103 and the fourth pixel unit 1104 may be two neighboring pixel units 110 refers to that at least one of the neighboring pixel units 110 of the third pixel unit 1103 is the fourth pixel unit 1104, and at least one of the neighboring pixel units 110 of the fourth pixel unit 1104 is the third pixel unit 1103. Optionally, the neighboring pixel units 110 of the third pixel unit 1103 are the fourth pixel unit 1104, and the neighboring pixel units 110 of the fourth pixel unit 1104 are the third pixel unit 1103, as shown in FIG. 16.

In a particular implementation, as shown in FIGS. 14 to 16, the channel types of the first driving transistors DT1 in the third pixel units 1103 may be a P type, the first electrodes of the first light emitting devices 22 are an anode, and the second electrodes of the first light emitting devices 22 are a cathode. The channel types of the second driving transistors DT2 in the fourth pixel units 1104 may be an N type, the first electrodes of the second light emitting devices 23 are a cathode, and the second electrodes of the second light emitting devices 23 are an anode. The voltage inputted by the first power-supply terminal 25 is greater than the voltage inputted by the second power-supply terminal 26. For example, the voltage signal inputted by the first power-supply terminal 25 may be the high-level signal VDD, and the voltage signal inputted by the second power-supply terminal 26 may be the low-level signal VSS.

Alternatively, the channel types of the first driving transistors DT1 in the third pixel units 1103 may be an N type, the first electrodes of the first light emitting devices 22 are a cathode, and the second electrodes of the first light emitting devices 22 are an anode. The channel types of the second driving transistors DT2 in the fourth pixel units 1104 may be a P type, the first electrodes of the second light emitting devices 23 are an anode, and the second electrodes of the second light emitting devices 23 are a cathode. The voltage inputted by the first power-supply terminal 25 is less than the voltage inputted by the second power-supply terminal 26. For example, the voltage signal inputted by the first power-supply terminal 25 may be the low-level signal VSS, and the voltage signal inputted by the second power-supply terminal 26 may be the high-level signal VDD.

FIGS. 14 to 16 show a structure in which one third pixel unit 1103 and one fourth pixel unit 1104 are connected. In other words, the first sub-pixel units in the one third pixel unit 1103 are connected in parallel, the second sub-pixel units in the one fourth pixel unit 1104 are connected in parallel, and subsequently the parallel-connected first sub-pixel units and the parallel-connected second sub-pixel units are connected in series.

In a particular implementation, optionally, the first sub-pixel units in a plurality of third pixel units 1103 (for example, 2*2, 33 or 2*3 and so on) are connected in parallel, the second sub-pixel units in a plurality of fourth pixel units 1104 (for example, 2*2, 3*3 or 2*3 and so on) are connected in parallel, and subsequently the parallel-connected first sub-pixel units and the parallel-connected second sub-pixel units are connected in series.

Another embodiment of the present disclosure further provides a light emitting apparatus, wherein the light emitting apparatus may include the light emitting base plate according to any one of the above embodiments.

In some embodiments, the light emitting apparatus may be an illuminating device. In this case, the light emitting apparatus serves as a light source, to realize the function of illumination. For example, the light emitting apparatus may be a backlight module in a liquid-crystal displaying device, or be used for a lamp for internal illumination or external illumination, or various signal lamps.

In some other embodiments, the light emitting apparatus may be a displaying device. In this case, the light emitting base plate is a displaying base plate, and is used to realize the function of displaying images (i.e., frames). The light emitting apparatus may include a display or a product including a display. The display may be a Flat Panel Display (FPD), a micro-display and so on. If classified based on whether the user can see the scene at the back face of the display, the display may be a transparent display or a non-transparent display. If classified based on whether the display can be bent or curled, the display may be a flexible display or a common display (which may be referred to as a rigid display). As an example, the product including a display may include: a computer display, a television set, a billboard, a laser printer having the function of displaying, a telephone, a mobile phone, a Personal Digital Assistant (PDA), a laptop computer, a digital camera, a portable camcorder, a viewfinder, a vehicle, a large-area wall, a theater screen, a stadium escutcheon and so on.

Another embodiment of the present disclosure further provides a driving method of a pixel circuit, wherein the method is for driving the pixel circuit according to any one of the above embodiments, and the driving method includes:

at the light-emission stage, controlling the first light emitting device and the second light emitting device to synchronously emit light.

As shown in FIG. 8, when the first driving circuit includes the first capacitor C1, the first resetting module 81, the first writing module 82, the first compensating module 83 and the first light-emission controlling module 84, and the second driving circuit includes the second capacitor C2, the second resetting module 85, the second writing module 86, the second compensating module 87 and the second light-emission controlling module 88, before the light-emission stage, the method may further include:

at the first resetting stage, controlling the signal of the first initialized-voltage terminal VINN to be transmitted to the grid electrode of the first driving transistor DT1 and the second electrode of the first capacitor C1, controlling the source electrode of the first driving transistor DT1 to be disconnected from the first power-supply terminal 25, and controlling the drain electrode of the first driving transistor DT1 to be disconnected from the first electrode of the first light emitting device 22;

at the first writing stage, controlling the data signal of the first data writing terminal Data1 to be written into the source electrode of the first driving transistor DT1, controlling the drain electrode of the first driving transistor DT1 to be conducted with the grid electrode of the first driving transistor DT1, controlling the source electrode of the first driving transistor DT1 to be disconnected from the first power-supply terminal 25, and controlling the drain electrode of the first driving transistor DT1 to be disconnected from the first electrode of the first light emitting device 22;

at the second resetting stage, controlling the signal of the second initialized-voltage terminal VINP to be transmitted to the grid electrode of the second driving transistor DT2 and the second electrode of the second capacitor C2, controlling the source electrode of the second driving transistor DT2 to be disconnected from the second power-supply terminal 26, and controlling the drain electrode of the second driving transistor DT2 to be disconnected from the first electrode of the second light emitting device 23;

at the second writing stage, controlling the data signal of the second data writing terminal Data2 to be written into the source electrode of the second driving transistor DT2, controlling the drain electrode of the second driving transistor DT2 to be conducted with the grid electrode of the second driving transistor DT2, controlling the source electrode of the second driving transistor DT2 to be disconnected from the second power-supply terminal 26, and controlling the drain electrode of the second driving transistor DT2 to be disconnected from the first electrode of the second light emitting device 23; and at the light-emission stage, the method further includes: controlling the source electrode of the first driving transistor DT1 to be conducted with the first power-supply terminal 25, controlling the drain electrode of the first driving transistor DT1 to be conducted with the first electrode of the first light emitting device 22, controlling the source electrode of the second driving transistor DT2 to be conducted with the second power-supply terminal 26, and controlling the drain electrode of the second driving transistor DT2 to be conducted with the first electrode of the second light emitting device 23.

the second resetting stage and the first writing stage proceed synchronously.

The particular driving process has been described in detail in the embodiments of the pixel circuit, and is not discussed herein further.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The pixel circuit, the pixel driving method, the light emitting base plate and the light emitting apparatus according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

A person skilled in the art, after considering the description and implementing the invention disclosed herein, will readily envisage other embodiments of the present disclosure. The present disclosure aims at encompassing any variations, uses or adaptative alternations of the present disclosure, wherein those variations, uses or adaptative alterations follow the general principle of the present disclosure and include common knowledge or common technical means in the art that are not disclosed by the present disclosure. The description and the embodiments are merely deemed as exemplary, and the true scope and spirit of the present disclosure are presented by the following claims.

It should be understood that the present disclosure is not limited to the accurate structure that has been described above and shown in the drawings, and may have various modifications and variations without departing from its scope. The scope of the present disclosure is merely limited by the appended claims.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A pixel circuit, wherein the pixel circuit comprises a first driving circuit, a first light emitting device, a second light emitting device and a second driving circuit that are sequentially connected in series;
   the first driving circuit comprises a first driving transistor, a source electrode of the first driving transistor is connected to a first power-supply terminal, and a drain electrode of the first driving transistor is connected to a first electrode of the first light emitting device;
   the second driving circuit comprises a second driving transistor, a source electrode of the second driving transistor is connected to a second power-supply terminal, and a drain electrode of the second driving transistor is connected to a first electrode of the second light emitting device;
   a second electrode of the first light emitting device is connected to a second electrode of the second light emitting device; and
   a channel type of the first driving transistor and a channel type of the second driving transistor are different.

2. The pixel circuit according to claim 1, wherein the channel type of the first driving transistor is a P type, the channel type of the second driving transistor is an N type, the first electrode of the first light emitting device is an anode, the first electrode of the second light emitting device is a cathode, and a voltage inputted by the first power-supply terminal is greater than a voltage inputted by the second power-supply terminal; or
   the channel type of the first driving transistor is an N type, the channel type of the second driving transistor is a P type, the first electrode of the first light emitting device is a cathode, the first electrode of the second light emitting device is an anode, and a voltage inputted by the first power-supply terminal is less than a voltage inputted by the second power-supply terminal.

3. The pixel circuit according to claim 1, wherein the pixel circuit further comprises:
   a bleeder component, connected to a first node, wherein the first node is connected to the second electrode of the first light emitting device and the second electrode of the second light emitting device, so that a difference between an electric current in the first light emitting device and an electric current in the second light emitting device is equal to an electric current in the bleeder component.

4. The pixel circuit according to claim 3, wherein the bleeder component comprises a first transistor and a second transistor that have a same channel type;
   a first electrode of the first transistor is connected to a first voltage inputting terminal, and a second electrode of the first transistor and a grid electrode of the first transistor are connected to the first node; and
   a first electrode of the second transistor is connected to the first node, and a second electrode of the second transistor and a grid electrode of the second transistor are connected to a second voltage inputting terminal.

5. The pixel circuit according to claim 1, wherein the first driving circuit comprises:
   a first capacitor, wherein a first electrode of the first capacitor is connected to the first power-supply terminal, and a second electrode of the first capacitor is connected to a grid electrode of the first driving transistor;
   a first resetting module configured for, at a first resetting stage, transmitting a signal of a first initialized-voltage terminal to the grid electrode of the first driving transistor and the second electrode of the first capacitor;
   a first writing module configured for, at a first writing stage, writing a data signal of a first data writing terminal into the source electrode of the first driving transistor;
   a first compensating module configured for, at the first writing stage, conducting the drain electrode of the first driving transistor with the grid electrode of the first driving transistor; and
   a first light-emission controlling module configured for, at the first resetting stage and the first writing stage, disconnecting the source electrode of the first driving transistor from the first power-supply terminal, disconnecting the drain electrode of the first driving transistor from the first electrode of the first light emitting device, and, at a light-emission stage, conducting the source electrode of the first driving transistor with the first power-supply terminal, and conducting the drain electrode of the first driving transistor with the first electrode of the first light emitting device; and
   the second driving circuit comprises:
   a second capacitor, wherein a first electrode of the second capacitor is connected to the second power-supply terminal, and a second electrode of the second capacitor is connected to a grid electrode of the second driving transistor;
   a second resetting module configured for, at a second resetting stage, transmitting a signal of a second initialized-voltage terminal to the grid electrode of the second driving transistor and the second electrode of the second capacitor;
   a second writing module configured for, at a second writing stage, writing a data signal of a second data writing terminal into the source electrode of the second driving transistor;
   a second compensating module configured for, at the second writing stage, conducting the drain electrode of the second driving transistor with the grid electrode of the second driving transistor; and
   a second light-emission controlling module configured for, at the second resetting stage and the second writing stage, disconnecting the source electrode of the second driving transistor from the second power-supply terminal, disconnecting the drain electrode of the second driving transistor from the first electrode of the second light emitting device, and, at the light-emission stage, conducting the source electrode of the second driving transistor with the second power-supply terminal, and conducting the drain electrode of the second driving transistor with the first electrode of the second light emitting device.

6. A light emitting base plate, wherein the light emitting base plate comprises the pixel circuit according to claim 1.

7. The light emitting base plate according to claim 6, wherein the light emitting base plate comprises a plurality of pixel units, and the first light emitting device and the second light emitting device are located in a same pixel unit.

8. The light emitting base plate according to claim 7, wherein in the same pixel unit, the pixel circuit further comprises a third light emitting device and a third driving circuit;
- the third driving circuit comprises a third driving transistor, a source electrode of the third driving transistor is connected to the second power-supply terminal, and a drain electrode of the third driving transistor is connected to a first electrode of the third light emitting device;
- a second electrode of the third light emitting device is connected to the second electrode of the first light emitting device and the second electrode of the second light emitting device; and
- a channel type of the third driving transistor and the channel type of the second driving transistor are the same.

9. The light emitting base plate according to claim 8, wherein the first light emitting device is a light emitting device capable of emitting a blue light, the second light emitting device is a light emitting device capable of emitting a green light, and the third light emitting device is a light emitting device capable of emitting a red light.

10. The light emitting base plate according to claim 8, wherein the plurality of pixel units comprise a first pixel unit and/or a second pixel unit, and the first pixel unit and the second pixel unit comprise the pixel circuit;
- in the first pixel unit, the channel type of the first driving transistor is a P type, the channel type of the second driving transistor and the channel type of the third driving transistor are an N type, the first electrode of the first light emitting device is an anode, the first electrode of the second light emitting device and the first electrode of the third light emitting device are a cathode, and a voltage inputted by the first power-supply terminal is greater than a voltage inputted by the second power-supply terminal; and
- in the second pixel unit, the channel type of the first driving transistor is an N type, the channel type of the second driving transistor and the channel type of the third driving transistor are a P type, the first electrode of the first light emitting device is a cathode, the first electrode of the second light emitting device and the first electrode of the third light emitting device are an anode, and a voltage inputted by the first power-supply terminal is less than a voltage inputted by the second power-supply terminal.

11. The light emitting base plate according to claim 10, wherein when the plurality of pixel units comprise the first pixel unit and the second pixel unit, the first pixel unit and the second pixel unit satisfy any one of the following conditions:
- the first pixel unit and the second pixel unit are located at different scanning lines of two neighboring scanning lines;
- the first pixel unit and the second pixel unit are located at different data columns of two neighboring data columns; and
- at least one of neighboring pixel units of the first pixel unit is the second pixel unit, and at least one of neighboring pixel units of the second pixel unit is the first pixel unit.

12. The light emitting base plate according to claim 6, wherein the light emitting base plate comprises a plurality of pixel units, the plurality of pixel units comprise a third pixel unit and a fourth pixel unit, the first light emitting device is located in the third pixel unit, and the second light emitting device is located in the fourth pixel unit.

13. The light emitting base plate according to claim 12, wherein the third pixel unit comprises one or more first sub-pixel units, each of the first sub-pixel units is provided with one instance of the first light emitting device and one instance of the first driving circuit, and the first light emitting devices in different instances of the first sub-pixel units are different;
- the fourth pixel unit comprises one or more second sub-pixel units, each of the second sub-pixel units is provided with one instance of the second light emitting device and one instance of the second driving circuit, and the second light emitting devices in different instances of the second sub-pixel units are different; and
- the second electrode of any one of the first light emitting devices of the third pixel units is connected to the second electrodes of the second light emitting devices of the fourth pixel units.

14. The light emitting base plate according to claim 13, wherein the third pixel unit and the fourth pixel unit are two neighboring pixel units, and the third pixel unit and the fourth pixel unit satisfy any one of the following conditions:
- the third pixel unit and the fourth pixel unit are located at different scanning lines of two neighboring scanning lines;
- the third pixel unit and the fourth pixel unit are located at different data columns of two neighboring data columns; and
- a neighboring pixel unit of the third pixel unit is the fourth pixel unit, and a neighboring pixel unit of the fourth pixel unit is the third pixel unit.

15. The light emitting base plate according to claim 13, wherein the channel types of the first driving transistors in the third pixel units are a P type, the first electrodes of the first light emitting devices are an anode, the channel types of the second driving transistors in the fourth pixel units are an N type, the first electrodes of the second light emitting devices are a cathode, and a voltage inputted by the first power-supply terminal is greater than a voltage inputted by the second power-supply terminal; or
- the channel types of the first driving transistors in the third pixel units are an N type, the first electrodes of the first light emitting devices are a cathode, the channel types of the second driving transistors in the fourth pixel units are a P type, the first electrodes of the second light emitting devices are an anode, and a voltage inputted by the first power-supply terminal is less than a voltage inputted by the second power-supply terminal.

16. A light emitting apparatus, wherein the light emitting apparatus comprises the light emitting base plate according to claim 6.

17. A driving method of a pixel circuit, wherein the method is for driving the pixel circuit according to claim 1, and the driving method comprises:
- at the light-emission stage, controlling the first light emitting device and the second light emitting device to synchronously emit light.

18. The driving method according to claim 17, wherein when the first driving circuit comprises the first capacitor, the first resetting module, the first writing module, the first compensating module and the first light-emission controlling module, and the second driving circuit comprises the second capacitor, the second resetting module, the second writing module, the second compensating module and the second light-emission controlling module, before the light-emission stage, the method further comprises:

at the first resetting stage, controlling the signal of the first initialized-voltage terminal to be transmitted to the grid electrode of the first driving transistor and the second electrode of the first capacitor, controlling the source electrode of the first driving transistor to be disconnected from the first power-supply terminal, and controlling the drain electrode of the first driving transistor to be disconnected from the first electrode of the first light emitting device;

at the first writing stage, controlling the data signal of the first data writing terminal to be written into the source electrode of the first driving transistor, controlling the drain electrode of the first driving transistor to be conducted with the grid electrode of the first driving transistor, controlling the source electrode of the first driving transistor to be disconnected from the first power-supply terminal, and controlling the drain electrode of the first driving transistor to be disconnected from the first electrode of the first light emitting device;

at the second resetting stage, controlling the signal of the second initialized-voltage terminal to be transmitted to the grid electrode of the second driving transistor and the second electrode of the second capacitor, controlling the source electrode of the second driving transistor to be disconnected from the second power-supply terminal, and controlling the drain electrode of the second driving transistor to be disconnected from the first electrode of the second light emitting device; and at the second writing stage, controlling the data signal of the second data writing terminal to be written into the source electrode of the second driving transistor, controlling the drain electrode of the second driving transistor to be conducted with the grid electrode of the second driving transistor, controlling the source electrode of the second driving transistor to be disconnected from the second power-supply terminal, and controlling the drain electrode of the second driving transistor to be disconnected from the first electrode of the second light emitting device;

at the light-emission stage, the method further comprises: controlling the source electrode of the first driving transistor to be conducted with the first power-supply terminal, controlling the drain electrode of the first driving transistor to be conducted with the first electrode of the first light emitting device, controlling the source electrode of the second driving transistor to be conducted with the second power-supply terminal, and controlling the drain electrode of the second driving transistor to be conducted with the first electrode of the second light emitting device; and the second resetting stage and the first writing stage proceed synchronously.

19. The light emitting apparatus according to claim 16, wherein the light emitting apparatus comprises a plurality of pixel units, and the first light emitting device and the second light emitting device are located in a same pixel unit.

20. The light emitting apparatus according to claim 19, wherein in the same pixel unit, the pixel circuit further comprises a third light emitting device and a third driving circuit;

the third driving circuit comprises a third driving transistor, a source electrode of the third driving transistor is connected to the second power-supply terminal, and a drain electrode of the third driving transistor is connected to a first electrode of the third light emitting device;

a second electrode of the third light emitting device is connected to the second electrode of the first light emitting device and the second electrode of the second light emitting device; and a channel type of the third driving transistor and the channel type of the second driving transistor are the same.

\* \* \* \* \*